United States Patent
Koshiishi et al.

(10) Patent No.: US 10,229,815 B2
(45) Date of Patent: Mar. 12, 2019

(54) PLASMA ETCHING APPARATUS AND METHOD

(71) Applicant: TOKYO ELECTRON LIMITED, Tokyo (JP)

(72) Inventors: Akira Koshiishi, Yamanashi (JP); Noriyuki Kobayashi, Yamanashi (JP); Shigeru Yoneda, Yamanashi (JP); Kenichi Hanawa, Yamanashi (JP); Shigeru Tahara, Yamanashi (JP); Masaru Sugimoto, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 485 days.

(21) Appl. No.: 14/489,125

(22) Filed: Sep. 17, 2014

(65) Prior Publication Data
US 2015/0000843 A1   Jan. 1, 2015

Related U.S. Application Data

(62) Division of application No. 11/867,371, filed on Oct. 4, 2007, now Pat. No. 8,852,385.

(30) Foreign Application Priority Data

Oct. 6, 2006   (JP) .................................. 2006-275722
Jun. 22, 2007  (JP) .................................. 2007-164637
Sep. 28, 2007  (JP) .................................. 2007-254058

(51) Int. Cl.
*H01J 37/32*   (2006.01)
*H01L 21/311*  (2006.01)
(Continued)

(52) U.S. Cl.
CPC .. *H01J 37/32183* (2013.01); *H01J 37/32027* (2013.01); *H01J 37/32091* (2013.01);
(Continued)

(58) Field of Classification Search
CPC ........... H01J 37/32027; H01J 37/32091; H01J 37/32174; H01J 37/32183;
(Continued)

(56) References Cited

U.S. PATENT DOCUMENTS 4,263,088 A   4/1981  Gorin
4,795,529 A   1/1989  Kawasaki et al.
(Continued)

FOREIGN PATENT DOCUMENTS

JP   8-17807       1/1996
JP   10064696 A *  3/1998
(Continued)

OTHER PUBLICATIONS

Office Action dated May 12, 2010, in China Patent Application No. 200780036915.6 (with English-language Translation).
(Continued)

*Primary Examiner* — Yuechuan Yu
(74) *Attorney, Agent, or Firm* — Oblon, McClelland, Maier & Neustadt, L.L.P.

(57) ABSTRACT

A plasma etching apparatus includes a first RF power supply unit configured to apply a first RF power for plasma generation to a first electrode or a second electrode disposed opposite to each other in a process container configured to be vacuum-exhausted, a second RF power supply unit configured to apply a second RF power for ion attraction to the second electrode, and a controller configured to control the second RF power supply unit. The second RF power supply unit includes a second RF power supply and a second matching unit. The controller is preset to control the second
(Continued)

RF power supply unit to operate in a power modulation mode that executes power modulation in predetermined cycles between a first power and a second power, while controlling the second matching unit to switch a matching operation in synchronism with the power modulation.

14 Claims, 20 Drawing Sheets

Related U.S. Application Data

(60) Provisional application No. 60/971,946, filed on Sep. 13, 2007, provisional application No. 60/896,336, filed on Mar. 22, 2007.

(51) Int. Cl.
   *H01L 21/768* (2006.01)
   *H01L 21/3065* (2006.01)

(52) U.S. Cl.
   CPC .. *H01J 37/32137* (2013.01); *H01J 37/32165* (2013.01); *H01J 37/32174* (2013.01); *H01L 21/31116* (2013.01); *H01L 21/76802* (2013.01); *H01L 21/76834* (2013.01); *H01J 2237/334* (2013.01); *H01J 2237/3346* (2013.01); *H01L 21/30655* (2013.01)

(58) Field of Classification Search
   CPC .......... H01J 37/32165; H01J 37/32137; H01J 2237/334; H01J 2237/3346; H01L 21/31116; H01L 21/76834; H01L 21/76802; H01L 21/30655
   See application file for complete search history.

(56) References Cited

U.S. PATENT DOCUMENTS

| | | | |
|---|---|---|---|
| 6,200,651 B1* | 3/2001 | Roche | C23C 16/401 427/571 |
| 6,759,339 B1* | 7/2004 | Choi | B82Y 10/00 257/E21.311 |
| 2003/0196757 A1* | 10/2003 | Todorow | H01J 37/321 156/345.24 |
| 2004/0055995 A1 | 3/2004 | Westerman et al. | |
| 2004/0124177 A1* | 7/2004 | Urban | B81C 1/00579 216/67 |
| 2005/0103748 A1* | 5/2005 | Yamaguchi | H01L 21/31116 216/67 |
| 2006/0037701 A1* | 2/2006 | Koshiishi | H01J 37/32082 156/345.44 |
| 2006/0066247 A1 | 3/2006 | Koshiishi et al. | |

FOREIGN PATENT DOCUMENTS

| | | | | |
|---|---|---|---|---|
| JP | 10-340887 A | 12/1998 | | |
| JP | 11-3879 A | 1/1999 | | |
| JP | 11-340213 A | 12/1999 | | |
| JP | 2000-12524 A | 1/2000 | | |
| JP | 2000-173993 | 6/2000 | | |
| JP | 2000200771 A * | 7/2000 | | |
| JP | 2000-311890 A | 11/2000 | | |
| JP | 2000323460 A * | 11/2000 | | |
| JP | 2001-156051 A | 6/2001 | | |
| JP | 2002-110647 A | 4/2002 | | |
| JP | 2002-270586 | 9/2002 | | |
| JP | 2004-87875 | 3/2004 | | |
| JP | 2004-96066 A | 3/2004 | | |
| JP | 2004096066 A * | 3/2004 | ............ H01J 37/321 |
| JP | 2006-148156 A | 6/2006 | | |
| JP | 2006-270017 A | 10/2006 | | |
| KR | 10-2007-0094476 | 9/2007 | | |
| WO | WO 2004/102638 A2 | 11/2004 | | |
| WO | WO 2005/124844 A1 | 12/2005 | | |

OTHER PUBLICATIONS

International Search Report dated Dec. 25, 2007 in corresponding International Application No. PCT/JP2007/069563.

Office Action dated Jan. 24, 2011, in Korean Patent Application No. 10-2009-7006959 with Partial English translation.

* cited by examiner

Elliptical via-hole

Small via-hole
(Circular shape)

Trench
(GR)

PLASMA ETCHING APPARATUS AND METHOD

The present application is a divisional application of and claims the benefit of priority under 35 U.S.C. § 120 from U.S. application Ser. No. 11/867,371, filed Oct. 4, 2007, the entire contents of which is incorporated herein by reference and which is based upon and claims the benefit of priority under 35 U.S.C. § 119 from Japanese Patent Applications. No. 2006-275722, filed Oct. 6, 2006, No. 2007-164637, filed Jun. 22, 2007 and No. 2007-254058, filed Sep. 28, 2007; and from U.S. Applications No. 60/896,336, filed Mar. 22, 2007 and No. 60/971,946, filed Sep. 13, 2007.

BACKGROUND OF THE INVENTION

1. Field of the Invention

The present invention relates to a plasma etching apparatus, plasma etching method, and computer readable storage medium, used for performing a plasma etching on a target substrate, such as a semiconductor substrate.

2. Description of the Related Art

For example, in the process of manufacturing semiconductor devices, plasma etching processes, which utilize a plasma to etch a layer through a resist mask, are often used for forming a predetermined pattern on a predetermined layer disposed on a target substrate, such as a semiconductor wafer.

Although various plasma etching apparatuses for performing such plasma etching are present, parallel-plate plasma etching apparatuses of the capacitive coupling type are in the mainstream of them.

In general, a parallel-plate plasma etching apparatus of the capacitive coupling type includes a chamber with a pair of parallel-plate electrodes (upper and lower electrodes) disposed therein. While a process gas is supplied into the chamber, an RF (radio frequency) power is applied to at least one of the electrodes to form an electric field between the electrodes. The process gas is turned into plasma by the RF electric field, thereby performing plasma etching on a predetermined layer disposed on a semiconductor wafer.

Specifically, there is known a plasma etching apparatus in which an RF power for plasma generation is applied to the upper electrode to generate plasma, while an RF power for ion attraction is applied to the lower electrode (for example, Jpn. Pat. Appln. KOKAI Publication No. 2000-173993 (Patent publication 1)). This plasma etching apparatus can form a suitable plasma state and realize an etching process with a high selectivity and high reproducibility.

In recent years, owing to the demands of higher speed of semiconductor devices, and increased miniaturization and higher integration degree of interconnection line patterns, it is promoted to utilize inter-level insulating films having a low dielectric constant, so as to decrease the parasitic capacitance of interconnection lines. Of the low dielectric constant films (Low-k films) of this kind, SiOC family films particularly attract attentions. An SiOC family film can be formed from a conventional $SiO_2$ film by introducing methyl groups ($-CH_3$) into Si$-$O bonds of the film, thereby mixing Si$-CH_3$ bonds.

Where plasma etching is performed on an organic Low-k film, such as an SiOC family film, it is important to ensure a sufficient selectivity between the organic Low-k film and a mask layer or an underlying film. In general, a mixture gas based on a fluorocarbon gas is used as a process gas to provide a relatively high selectivity of a target film relative to an underlying film, but this is not enough to ensure a sufficient selectivity. In light of this problem, an etching method has been proposed for etching an SiOC family film, as described below, to improve the selectivity relative to a silicon nitride film (for example, Jpn. Pat. Appln. KOKAI Publication No. 2002-270586 (Patent publication 2)). Specifically, plasma etching is performed on an SiOC family inter-level insulating film while a silicon nitride film used as a barrier layer of a Cu interconnection line is utilized as an underlying etching-stopper layer. In this method, $C_4F_8/Ar/N_2$ is used as a process gas with a flow rate ratio of Ar set to be 80% or more, thereby improving the selectivity relative to the underlying film.

Further, another etching method has been proposed as described below (for example, Jpn. Pat. Appin. KOKAI Publication No. 2004-87875 (Patent publication 3)). Specifically, as in Patent publication 2 described above, plasma etching is performed on an SiOC family inter-level insulating film while a silicon nitride film is utilized as an underlying etching-stopper layer. This method comprises a first etching step of using $CHF_3/Ar/N_2$ as a process gas and a second etching step of using $C_4F_8/Ar/N_2$ as a process gas, thereby improving the selectivity relative to both of the mask and silicon nitride film.

However, as described above, silicon nitride used for a barrier layer of a Cu interconnection line has good barrier properties, but has a high dielectric constant of 7.0. Accordingly, in order to sufficiently utilize the low dielectric constant property of a Low-k film, such as an SiOC family film, a barrier layer having a still lower dielectric constant is required. One of the materials for such a barrier layer is silicon carbide (SiC) having a dielectric constant of 3.5.

Where an SiC barrier layer having a low dielectric constant is used as an underlying etching-stopper layer for etching an etching target layer formed of a Low-k film disposed thereon, it is also necessary to ensure a sufficient etching selectivity between them. In general, SiC family films of this kind contain about 10% oxygen, and thus the composition thereof is similar to that of SiOC family Low-k films. A plasma etching process using a fluorocarbon process gas, as disclosed in Patent publications 2 and 3 described above, may be applied to a structure including an SiOC family Low-k film and an SiC layer. In this case, however, the margin for ensuring a sufficient etching selectivity between the film and layer is narrow and makes it difficult to etch the SiOC family Low-k film with a high selectivity and a high etching rate.

On the other hand, where etching of via holes or contact holes is performed in a parallel-plate plasma etching apparatus of the capacitive coupling type, a so-called micro-loading effect is undesirably caused, such that the etching rate varies depending on the size of holes, and makes it difficult to control the etching depth. Particularly, the etching rate is generally higher at a large area, such as a guard ring (GR), while the etching rate is generally lower in a smaller area which CF family radicals cannot easily get in.

Where no etching-stopper layer is disposed, the etching depth fluctuates due to the micro-loading effect, and carries over the fluctuations to subsequent steps, thereby deteriorating the uniformity of electric properties. Even where an etching-stopper layer is disposed, an over etching time needs to be prolonged, and thus brings about additional losses and fluctuations on the underlying layers, which adversely affect electric properties.

Conventionally, in order to solve the problems described above, the pressure inside a chamber is decreased to perform an etching process at a low pressure along with a low flow rate, so as to promote etching at, e.g., small via-holes.

However, with decreases in the pressure and flow rate during a process, the selectivity relative to a mask and/or an underlying layer becomes smaller, thereby deteriorating the flexibility of the process.

BRIEF SUMMARY OF THE INVENTION

An object of the present invention is to provide a plasma etching apparatus and plasma etching method, which can etch an etching target film with a high selectivity and a high etching rate.

Another object of the present invention is to provide a plasma etching apparatus and plasma etching method, which can suppress the micro-loading effect.

Another object of the present invention is to provide a computer readable storage medium for executing the plasma etching method.

According to a first aspect of the present invention, there is provided a plasma etching apparatus comprising: a process container configured to be vacuum-exhausted; a first electrode disposed inside the process container; a second electrode disposed opposite to the first electrode and configured to support a target substrate thereon; a first RF power supply unit configured to apply a first RF power for plasma generation to the first electrode or the second electrode; a second RF power supply unit configured to apply a second RF power for ion attraction to the second electrode; a process gas supply unit configured to supply a process gas into the process container; and a controller configured to control the second RF power supply unit, wherein the controller is preset to control the second RF power supply unit to operate in a power modulation mode that executes power modulation in predetermined cycles between a first power set to deposit polymers on a predetermined film on the target substrate and a second power set to promote etching of the predetermined film on the target substrate.

In the first aspect, the plasma etching apparatus may be arranged for processing a target substrate having a structure including an etching target film formed on an underlying film to perform etching of the etching target film and then perform over etching, wherein the controller may be preset to control the second RF power supply unit to operate in a continuous mode that executes continuous supply of an RF power at a constant power level for the etching, and then, before the over etching starts, to switch into the power modulation mode that executes power modulation in predetermined cycles between the first power set to deposit polymers on the predetermined film on the target substrate and the second power set to promote etching of the predetermined film on the target substrate.

In this arrangement, the controller may be preset to control the second RF power to perform power modulation between the first power and the second power to attain a condition in which a polymer thickness on the underlying film is larger than an ion penetration depth at a timing of transition from the etching of the etching target film to the over etching. In this case, the controller may be preset to control at least one of the first power, the second power, power modulation frequency, power modulation duty ratio, and timing for switching from the continuous mode to the power modulation mode.

In the first aspect, the plasma etching apparatus may be arranged for processing a target substrate having a structure including a mask layer formed on an etching target film to perform etching of the etching target film by use of the mask layer as a mask, wherein the controller may be preset to control the second RF power supply unit to switch into the power modulation mode that executes power modulation in predetermined cycles between the first power set to deposit polymers on the predetermined film on the target substrate and the second power set to promote etching of the predetermined film on the target substrate, for the etching of the etching target film.

According to a second aspect of the present invention, there is provided a plasma etching apparatus comprising: a process container configured to be vacuum-exhausted; a first electrode disposed inside the process container; a second electrode disposed opposite to the first electrode and configured to support a target substrate thereon; a first RF power supply unit configured to apply a first RF power for plasma generation to the first electrode or the second electrode; a second RF power supply unit configured to apply a second RF power for ion attraction to the second electrode; a process gas supply unit configured to supply a process gas into the process container; and a controller configured to control the second RF power supply unit, wherein the second RF power supply unit includes a second RF power supply and a second matching unit, and the controller is preset to control the second RF power supply unit to operate in a power modulation mode that executes power modulation in predetermined cycles between a first power and a second power, while controlling the second matching unit to switch a matching operation in synchronism with the power modulation.

In the second aspect, the controller may be preset to control the second RF power supply unit operated in the power modulation mode such that the second matching unit is not operated when the first power is applied, and the second matching unit is operated when the first power is applied, so as for an internal impedance of the second RF power supply and a load impedance including plasma within the process container to agree with each other. In this case, the controller may be preset to control the second RF power supply unit operated in the power modulation mode such that, when the first power is applied, the second RF power supply is controlled to keep constant a power value supplied to the second electrode, which is defined by a difference between a power value output from the second RF power supply and a power value reflected by the load impedance including plasma within the process container.

In the first and second aspects, the apparatus preferably further comprises a variable DC power supply configured to apply a DC voltage to the first electrode.

According to a third aspect of the present invention, there is provided a plasma etching apparatus comprising: a process container configured to be vacuum-exhausted; a first electrode disposed inside the process container; a second electrode disposed opposite to the first electrode and configured to support a target substrate thereon; a first RF power supply unit configured to apply a first RF power for plasma generation to the first electrode or the second electrode; a second RF power supply unit configured to apply a second RF power for ion attraction to the second electrode; a process gas supply unit configured to supply a process gas into the process container; and a controller configured to control the second RF power supply unit, wherein the controller is preset to control the second RF power supply unit to operate in a power modulation mode that executes power modulation in predetermined cycles between a first power and a second power, such that the second RF power supply unit is first operated in a mode that executes continuous supply of an RF power at a constant power level for plasma ignition, and then is switched into the power modulation mode.

In the third aspect, the controller may be preset to perform control such that the second RF power supply unit is first operated in the mode that executes continuous supply of an RF power at a constant power level, then the first RF power supply unit starts RF power supply when a predetermined time has elapsed, and then the second RF power supply unit is switched into the power modulation mode when a predetermined time has elapsed. In this case, the controller may be preset to perform control such that the second RF power supply unit is first operated in the mode that executes continuous supply of an RF power at a constant power level, which is lower than a predetermined power level, until a time after the first RF power supply unit starts RF power supply, then the second RF power supply unit increases the RF power when a predetermined time has elapsed, and then the second RF power supply unit is switched into the power modulation mode when a predetermined time has elapsed. The apparatus may further comprise a variable DC power supply configured to apply a DC voltage to the first electrode, and the controller may be preset to control the variable DC power supply to start voltage application when the first RF power supply unit starts RF power supply. In this case, the controller is preferably preset to control the variable DC power supply to gradually increase voltage when starting the voltage application. The controller is preferably preset to control the second RF power supply unit to gradually increase power when switching into the power modulation mode after the mode that executes continuous supply of an RF power at a constant power level.

In the first to third aspects, the first RF power preferably has a frequency of 27 to 100 MHz. The second RF power preferably has a frequency of 400 kHz to 13.56 MHz. The first power is preferably set to be within a range of 10 to 500 W and the second power is preferably set to be within a range of 100 to 5,000 W in the power modulation mode of the second RF power supply unit. The power modulation preferably has a frequency within a range of 0.25 to 100 Hz in the power modulation mode of the second RF power supply unit. The power modulation preferably has a duty ratio (second power time/one cycle total time) of 1 to 99% in the power modulation mode of the second RF power supply unit. The controller may be preset to control the first RF power supply unit to operation in a power modulation mode that executes power modulation in predetermined cycles between a third power and a fourth power in synchronism with the power modulation mode of the second RF power supply unit.

According to a fourth aspect of the present invention, there is provided a plasma etching method performed in a plasma etching apparatus comprising a process container configured to be vacuum-exhausted, a first electrode disposed inside the process container, a second electrode disposed opposite to the first electrode and configured to support a target substrate thereon, a first RF power supply unit configured to apply a first RF power for plasma generation to the first electrode or the second electrode, a second RF power supply unit configured to apply a second RF power for ion attraction to the second electrode, and a process gas supply unit configured to supply a process gas into the process container, the method comprising: generating plasma of the process gas between the first electrode and the second electrode, thereby etching a predetermined film on the target substrate, wherein the method comprises controlling the second RF power supply unit to operate in a power modulation mode that executes power modulation in predetermined cycles between a first power set to deposit polymers on the predetermined film on the target substrate and a second power set to promote etching of the predetermined film on the target substrate.

In the fourth aspect, the plasma etching method may be arranged for processing a target substrate having a structure including an etching target film formed on an underlying film by generating plasma of the process gas between the first electrode and the second electrode, thereby etching an etching target film on the target substrate, and then performing over etching, wherein the method may be arranged to control the second RF power supply unit to operate in a continuous mode that executes continuous supply of an RF power at a constant power level for the etching, and then, before the over etching starts, to switch into the power modulation mode that executes power modulation in predetermined cycles between the first power set to deposit polymers on the predetermined film on the target substrate and the second power set to promote etching of the predetermined film on the target substrate.

In this arrangement, the method may be arranged to control the second RF power to perform power modulation between the first power and the second power to attain a condition in which a polymer thickness on the underlying film is larger than an ion penetration depth at a timing of transition from the etching of the etching target film to the over etching. In this case, the method may be arranged to control at least one of the first power, the second power, power modulation frequency, power modulation duty ratio, and timing for switching from the continuous mode to the power modulation mode, so as to attain a condition in which a polymer thickness on the underlying film is larger than an ion penetration depth. The method according to the fourth aspect is preferably applied to a case where an etching target film on the target substrate is formed of an SiOC family Low-k film and an underlying film is formed of an SiC film.

In the fourth aspect, the plasma etching method may be arranged for processing a target substrate having a structure including a mask layer formed on an etching target film to perform etching of the etching target film by use of the mask layer as a mask, wherein the method may be arranged to control the second RF power supply unit to switch into the power modulation mode that executes power modulation in predetermined cycles between the first power set to deposit polymers on the predetermined film on the target substrate and the second power set to promote etching of the predetermined film on the target substrate, for the etching of the etching target film.

According to a fifth aspect of the present invention, there is provided a plasma etching method performed in a plasma etching apparatus comprising a process container configured to be vacuum-exhausted, a first electrode disposed inside the process container, a second electrode disposed opposite to the first electrode and configured to support a target substrate thereon, a first RF power supply unit configured to apply a first RF power for plasma generation to the first electrode or the second electrode, a second RF power supply unit configured to apply a second RF power for ion attraction to the second electrode, and a process gas supply unit configured to supply a process gas into the process container, wherein the second RF power supply unit includes a second RF power supply and a second matching unit, the method comprising: generating plasma of the process gas between the first electrode and the second electrode, thereby etching a predetermined film on the target substrate, wherein the method comprises controlling the second RF power supply unit to operate in a power modulation mode that executes power modulation in predetermined cycles between a first power and a second power, while controlling the second matching unit to switch a matching operation in synchronism with the power modulation.

In the fifth aspect, the method may be arranged to control the second RF power supply unit operated in the power modulation mode such that the second matching unit is not operated when the first power is applied, and the second matching unit is operated when the first power is applied, so as for an internal impedance of the second RF power supply and a load impedance including plasma within the process container to agree with each other. In this case, the method may be arranged to control the second RF power supply unit operated in the power modulation mode such that, when the first power is applied, the second RF power supply is controlled to keep constant a power value supplied to the second electrode, which is defined by a difference between a power value output from the second RF power supply and a power value reflected by the load impedance including plasma within the process container.

In the fourth and fifth aspects, the apparatus preferably further comprises a variable DC power supply configured to apply a DC voltage to the first electrode.

According to a sixth aspect of the present invention, there is provided a plasma etching method performed in a plasma etching apparatus comprising a process container configured to be vacuum-exhausted, a first electrode disposed inside the process container, a second electrode disposed opposite to the first electrode and configured to support a target substrate thereon, a first RF power supply unit configured to apply a first RF power for plasma generation to the first electrode or the second electrode, a second RF power supply unit configured to apply a second RF power for ion attraction to the second electrode, and a process gas supply unit configured to supply a process gas into the process container, the method comprising: generating plasma of the process gas between the first electrode and the second electrode, thereby etching a predetermined film on the target substrate, wherein the method comprises controlling the second RF power supply unit to operate in a power modulation mode that executes power modulation in predetermined cycles between a first power and a second power, such that the second RF power supply unit is first operated in a mode that executes continuous supply of an RF power at a constant power level for plasma ignition, and then is switched into the power modulation mode.

In the sixth aspect, the method may be arranged to perform control such that the second RF power supply unit is first operated in the mode that executes continuous supply of an RF power at a constant power level, then the first RF power supply unit starts RF power supply when a predetermined time has elapsed, and then the second RF power supply unit is switched into the power modulation mode when a predetermined time has elapsed. In this case, the method may be arranged to perform control such that the second RF power supply unit is first operated in the mode that executes continuous supply of an RF power at a constant power level, which is lower than a predetermined power level, until a time after the first RF power supply unit starts RF power supply, then the second RF power supply unit increases the RF power when a predetermined time has elapsed, and then the second RF power supply unit is switched into the power modulation mode when a predetermined time has elapsed. The apparatus may further comprise a variable DC power supply configured to apply a DC voltage to the first electrode, and the method may be arranged to control the variable DC power supply to start voltage application when the first RF power supply unit starts RF power supply. In this case, the method is preferably arranged to control the variable DC power supply to gradually increase voltage when starting the voltage application. The method is preferably arranged to control the second RF power supply unit to gradually increase power when switching into the power modulation mode after the mode that executes continuous supply of an RF power at a constant power level.

In the fourth to sixth aspects, the first RF power preferably has a frequency of 27 to 100 MHz. The second RF power preferably has a frequency of 400 kHz to 13.56 MHz. The first power is preferably set to be within a range of 10 to 500 W and the second power is preferably set to be within a range of 100 to 5,000 W in the power modulation mode of the second RF power supply unit. The power modulation preferably has a frequency within a range of 0.25 to 100 Hz in the power modulation mode of the second RF power supply unit. The power modulation preferably has a duty ratio (second power time/one cycle total time) of 1 to 99% in the power modulation mode of the second RF power supply unit. The method may be arranged to control the first RF power supply unit to operation in a power modulation mode that executes power modulation in predetermined cycles between a third power and a fourth power in synchronism with the power modulation mode of the second RF power supply unit.

According to a seventh aspect of the present invention, there is provided a computer readable storage medium that stores a control program for execution on a computer used for a plasma etching apparatus comprising a process container configured to be vacuum-exhausted, a first electrode disposed inside the process container, a second electrode disposed opposite to the first electrode and configured to support a target substrate thereon, a first RF power supply unit configured to apply a first RF power for plasma generation to the first electrode or the second electrode, a second RF power supply unit configured to apply a second RF power for ion attraction to the second electrode, and a process gas supply unit configured to supply a process gas into the process container, wherein the control program, when executed, causes the computer to control the plasma etching apparatus to conduct one of the plasma etching methods according to the fourth to sixth aspects.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will now be described with reference to the accompanying drawings.

At first, an explanation will be given of a first embodiment of the present invention.

Figure 1:
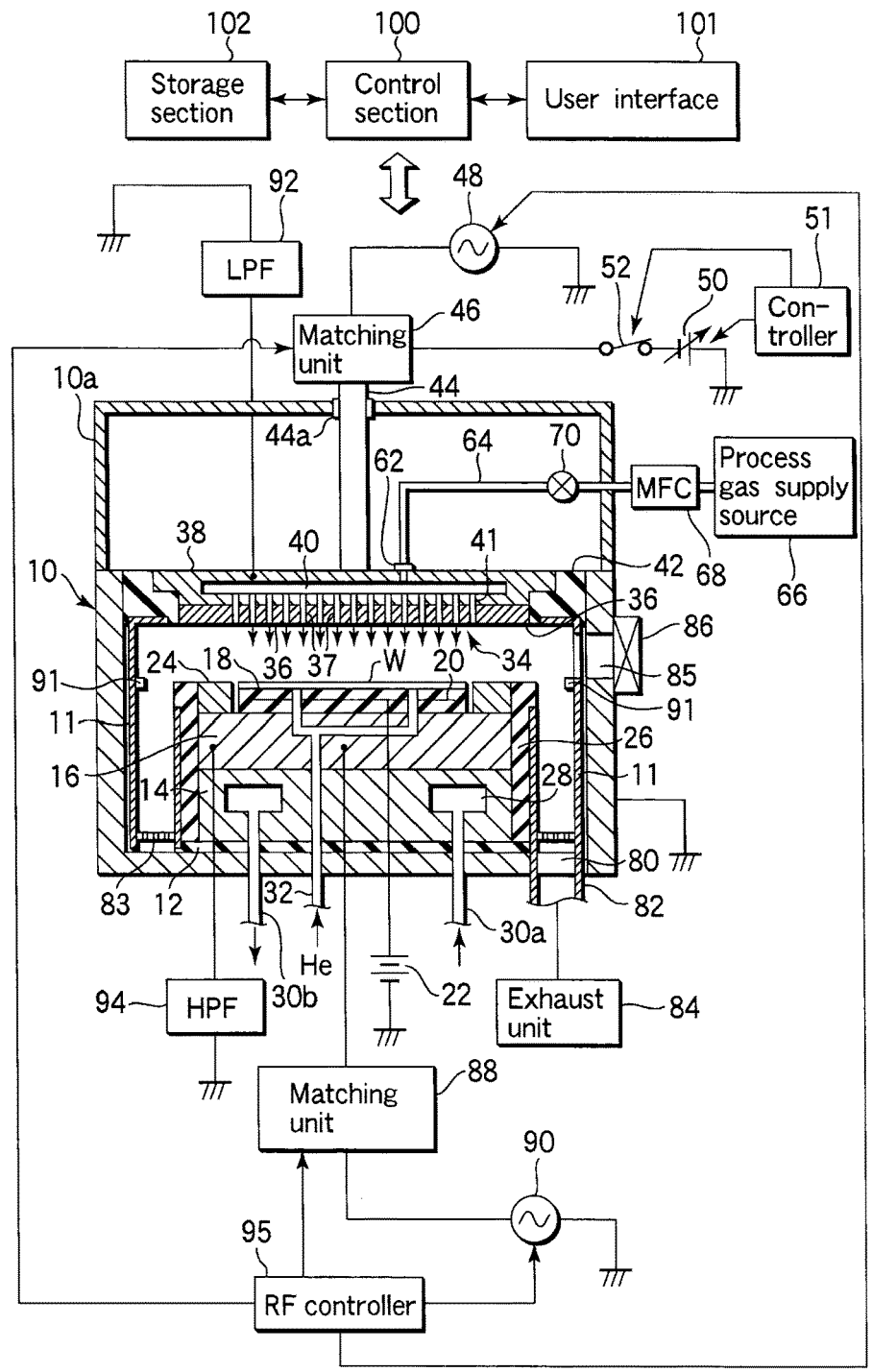
FIG. 1 is a sectional view schematically showing a plasma etching apparatus according to a first embodiment of the present invention.

FIG. 1 is a sectional view schematically showing a plasma etching apparatus according to the first embodiment of the present invention.

This plasma etching apparatus is structured as a parallel-plate plasma etching apparatus of the capacitive coupling type. The apparatus includes an essentially cylindrical chamber (process container) 10, which is made of, e.g., aluminum with an anodization-processed surface. The chamber 10 is protectively grounded.

A columnar susceptor pedestal 14 is disposed on the bottom of the chamber 10 through an insulating plate 12 made of, e.g., a ceramic. A susceptor 16 made of, e.g., aluminum is disposed on the susceptor pedestal 14. The susceptor 16 is used as a lower electrode, on which a target substrate, such as a semiconductor wafer W, is placed.

The susceptor 16 is provided with an electrostatic chuck 18 on the top, for holding the semiconductor wafer W by an electrostatic attraction force. The electrostatic chuck 18 comprises an electrode 20 made of a conductive film, and a pair of insulating layers or insulating sheets sandwiching the electrode 20. The electrode 20 is electrically connected to a direct current (DC) power supply 22. The semiconductor wafer W is attracted and held on the electrostatic chuck 18 by an electrostatic attraction force, e.g., a Coulomb force, generated by a DC voltage applied from the DC power supply 22.

A conductive focus ring (correction ring) 24 made of, e.g., silicon is disposed on the top of the susceptor 16 to surround the electrostatic chuck 18 (and the semiconductor wafer W) to improve etching uniformity. A cylindrical inner wall member 26 made of, e.g., quartz is attached to the side of the susceptor 16 and susceptor pedestal 14.

The susceptor pedestal 14 is provided with a cooling medium space 28 formed therein and extending therethrough in, e.g., an annular direction. A cooling medium set at a predetermined temperature, such as cooling water, is circulated within the cooling medium space 28 from a chiller unit (not shown) disposed outside through lines 30a and 30b. The temperature of the cooling medium is set to control the process temperature of the semiconductor wafer W placed on the susceptor 16.

Further, a heat transmission gas, such as He gas, is supplied from a heat transmission gas supply unit (not shown), through a gas supply line 32, into the interstice between the top surface of the electrostatic chuck 18 and the back surface of the semiconductor wafer W.

An upper electrode 34 is disposed above the lower electrode or susceptor 16 in parallel with the susceptor. The space between the electrodes 16 and 34 is used as a plasma generation space. The upper electrode 34 defines a counter surface facing the semiconductor wafer W placed on the lower electrode or susceptor 16, and thus this counter surface is in contact with plasma generation space.

The upper electrode 34 is supported at the top of the chamber 10 by an insulating shield member 42. The upper electrode 34 includes an electrode plate 36 defining the counter surface opposite to the susceptor 16 and having a number of gas delivery holes 37, and an electrode support 38 detachably supporting the electrode plate 36. The electrode support 38 is made of a conductive material, such as aluminum with an anodization-processed surface, and has a water-cooling structure. The electrode plate 36 is preferably made of a conductor or semiconductor having a low resistivity and thus generating less Joule heat. Further, in order to reinforce a resist film, as described later, the electrode plate 36 is preferably made of a silicon-containing substance. In light of these, the electrode plate 36 is preferably made of silicon or SiC. The electrode support 38 has a gas diffusion cell 40 formed therein, which is connected to the gas delivery holes 37 through a number of gas flow channels 41 extending downward.

Further, the electrode support 38 has a gas feed port 62 formed therein for feeding a process gas into the gas diffusion cell 40. The gas feed port 62 is connected to a process gas supply source 66 through a gas supply line 64. The gas supply line 64 is provided with a mass-flow controller (MFC) 68 and a switching valve 70 disposed thereon in this order from the upstream (an FCN may be used in place of the MFC). A process gas for etching, such as a fluorocarbon gas ($C_xF_y$), e.g., $C_4F_8$ gas, is supplied from the process gas supply source 66 through the gas supply line 64 into the gas diffusion cell 40. Then, the process gas flows through the gas flow channels 41 and is delivered from the gas delivery holes 37 into the plasma generation space, as in a shower device. Accordingly, in other words, the upper electrode 34 functions as a showerhead for supplying a process gas.

The upper electrode 34 is electrically connected to a first RF power supply 48 through a first matching unit 46 and a feed rod 44. The first RF power supply 48 outputs an RF power with a frequency of 27 to 100 MHz, such as 60 MHz. The first matching unit 46 is arranged to match the load impedance with the internal (or output) impedance of the first RF power supply 48. When plasma is generated within the chamber 10, the matching unit 44 performs control for the load impedance and the output impedance of the first RF power supply 48 to apparently agree with each other. The output terminal of the first matching unit 46 is connected to the top of the feed rod 44.

Further, the upper electrode 34 is electrically connected to a variable DC power supply 50 in addition to the first RF power supply 48. The variable DC power supply 50 may be formed of a bipolar power supply. Specifically, the variable DC power supply 50 is connected to the upper electrode 34 through the first matching unit 46 and feed rod 44, and the electric feeding can be set on/off by an on/off switch 52. The polarity, current, and voltage of the variable DC power supply 50, and the on/off of the on/off switch 52 are controlled by a controller 51.

Figure 2:
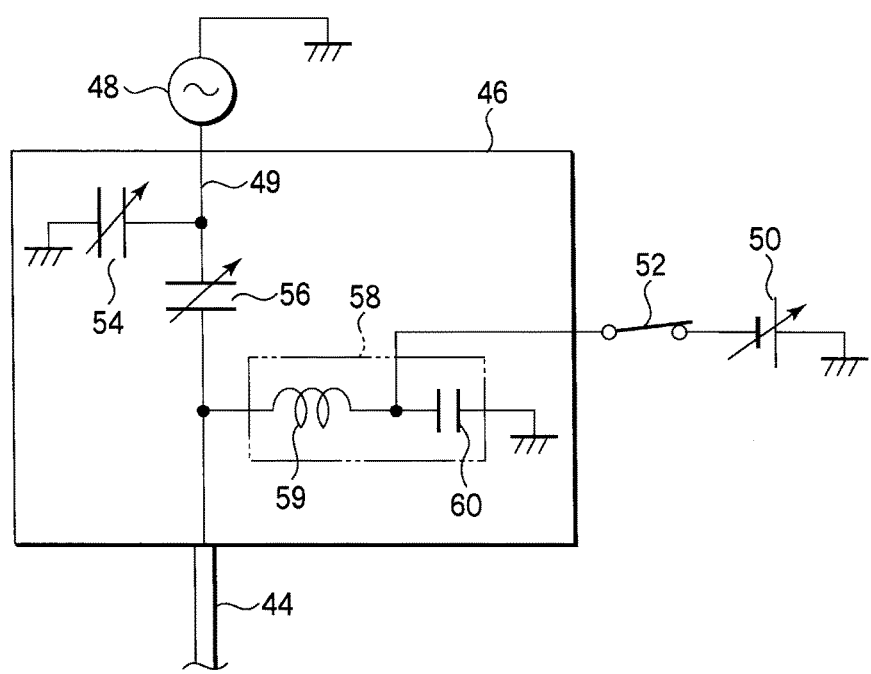
FIG. 2 is a view showing a matching unit connected to a first RF power supply in the plasma etching apparatus shown in FIG. 1.

As shown in FIG. 2, the first matching unit 46 includes a first variable capacitor 54 disposed on a line branched from a feed line 49 of the first RF power supply 48, and a second variable capacitor 56 disposed on the feed line 49 downstream from the branch point, so as to exercise the function described above. The first matching unit 46 also includes a filter 58 configured to trap the RF power (of 60 MHz, for example) from the first RF power supply 48 and the RF power (of 2 MHz, for example) from a second RF power supply described later, so that a DC voltage current (which will be simply referred to as a DC voltage) is effectively supplied to the upper electrode 34. Consequently, a DC current is connected from the variable DC power supply 50 through the filter 58 to the feed line 49. The filter 58 is formed of a coil 59 and a capacitor 60 arranged to trap the RF power from the first RF power supply 48 and the RF power from the second RF power supply described later.

The sidewall of the chamber 10 extends upward above the height level of the upper electrode 34 and forms a cylindrical grounded conductive body 10a. The top wall of the cylindrical grounded conductive body 10a is electrically insulated from the upper feed rod 44 by a tube-like insulating member 44a.

Figure 3:
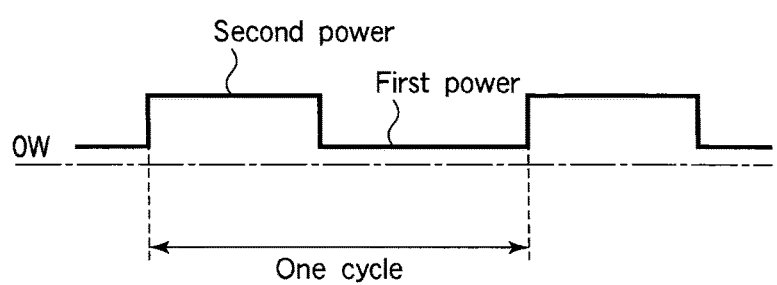
FIG. 3 is a view showing a typical example of a power modulation mode along with the set voltage thereof used for a second RF power supply.
Figure 4:
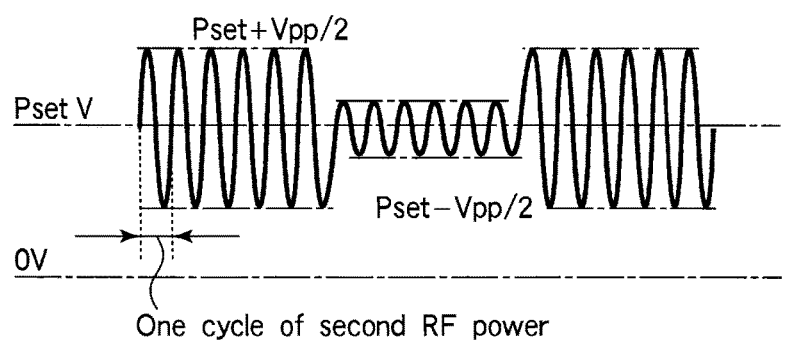
FIG. 4 is a view showing an output voltage waveform in a power modulation mode of the second RF power supply.

The susceptor 16 used as a lower electrode is electrically connected to a second RF power supply 90 through a second matching unit 88. The RF power supplied from the second RF power supply 90 to the lower electrode or susceptor 16 is used for applying a bias to the semiconductor wafer W, thereby attracting ions toward the semiconductor wafer W. The second RF power supply 90 outputs an RF power with a frequency of 400 kHz to 13.56 MHz, such as 2 MHz. The second RF power supply 90 is connected to an RF controller 95 for controlling the second RF power supply 90. The RF controller 95 can control the RF power from the second RF power supply 90 to perform power modulation between first and second powers in predetermined cycles, so that modes can be switched between an ordinary continuous mode and a power control mode. The first power is set to generate deposition on an etching target film on the semiconductor wafer W, while the second power is set to promote etching on the etching target film on the semiconductor wafer W. A typical example of the power modulation is pulse-wise, as shown in FIG. 3, but this is not limiting. In this example, the duty ratio of pulses is 50%. FIG. 4 shows the output voltage waveform obtained in this case. The difference between the maximum voltage value and minimum voltage value in one cycle is expressed by VPP. In FIG. 4, Pset denotes a set voltage.

The RF controller 95 is also connected to the second matching unit 88 to control the second matching unit 88. The RF controller 95 is further connected to the first RF power supply 48 and first matching unit 46 to control these members.

Figure 5:
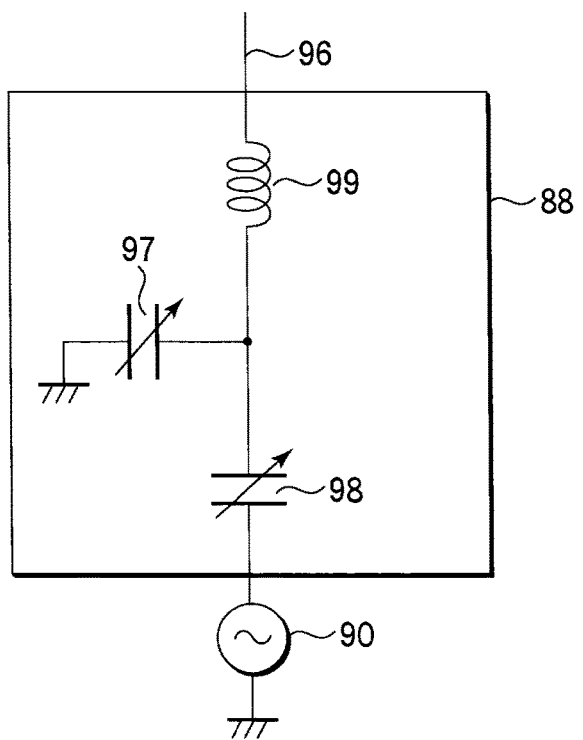
FIG. 5 is a view showing a matching unit connected to the second RF power supply in the plasma etching apparatus shown in FIG. 1.

The second matching unit 88 is arranged to match the load impedance with the internal (or output) impedance of the second RF power supply 90. When plasma is generated within the chamber 10, the second matching unit 88 performs control for the load impedance including the plasma within the chamber 10 and the internal impedance of the second RF power supply 90 to apparently agree with each other. As shown in FIG. 5, the second matching unit 88 includes a first variable capacitor 97 disposed on a line branched from the electric feeding line 96 of the second RF power supply 90, a second variable capacitor 98 disposed on the electric feeding line 96 between the branch point and second RF power supply 90, and a coil 99 disposed on the electric feeding line on the other side of the branch point. In this embodiment, unlike ordinary plasma etching, the RF power of the second RF power supply 90 is operated in a power modulation mode that executes power modulation in predetermined cycles. In this power modulation mode, the RF controller 95 controls the matching operation of the second matching unit 88 to be switched in synchronism with the power modulation. In this case, while the second RF power supply unit 90 is operated in the power modulation mode, the RF controller 95 controls the second matching unit 88, as follows. Specifically, when the first power is applied, the second matching unit 88 is controlled not to operate. On the other hand, when the second power is applied, the second matching unit 88 is controlled to operate for the load impedance including plasma within the chamber 10 and the internal impedance of the second RF power supply 90 to agree with each other. More specifically, only when the high-power-level second power is applied, the capacitance C1 of the first variable capacitor 97 and the capacitance C2 of the second variable capacitor 98 are controlled independently of each other. When the first power is applied, the capacitance C1 and capacitance C2 are fixed. In this case, if the forward direction power Pf is solely controlled as in ordinary matching units, hunching is caused. Accordingly, the second matching unit 88 has a structure that can control a load power PL (=Pf−Pr) defined in light of a reflection power. Specifically, where a power value Pf is output from the second RF power supply 90, and a power value Pr is reflected by the load impedance including plasma within the chamber, the power value PL applied to the lower electrode or susceptor 16 is defined by subtracting the power value Pr from the power value Pf. When the first power is applied, the second RF power supply 90 is controlled to keep the power value PL always constant. The first RF power supply 46 receives some influence of power modulation made on the RF power from the second RF power supply 90, so the first RF power supply 46 is also preferably provided with a matching unit including load power control, thereby performing control in the same way.

The upper electrode 34 is electrically connected to a low-pass filter (LPF) 92, which prevents the RF power (60 MHz) from the first RF power supply 48 from passing through, while it allows the RF power (2 MHz) from the second RF power supply 98 to pass through to ground. The low-pass filter (LPF) 92 is preferably formed of an LR filter or LC filter, but merely one conductive line may be used for the same purpose, because it can apply a sufficiently large reactance to the RF power (60 MHz) from the first RF power supply 48. On the other hand, the lower electrode or susceptor 16 is electrically connected to a high-pass filter (HPF) 94, which allows the RF power (60 MHz) from the first RF power supply 48 to pass through to ground.

An exhaust port 80 is formed at the bottom of the chamber 10, and is connected to an exhaust unit 84 through an exhaust line 82. The exhaust unit 84 includes a vacuum pump, such as a turbo molecular pump, to decrease the pressure inside the chamber 10 to a predetermined vacuum level. A transfer port 85 for a semiconductor wafer W is formed in the sidewall of the chamber 10, and is opened/closed by a gate valve 86 attached thereon. A deposition shield 11 is detachably disposed along the inner wall of the chamber 10 to prevent etching by-products (deposition) from being deposited on the wall. In other words, the deposition shield 11 constitutes a chamber wall. A deposition shield 11 is also disposed around the inner wall member 26. An exhaust plate 83 is disposed at the bottom of the chamber 10 between the deposition shield 11 on the chamber wall and the deposition shield 11 on the inner wall member 26. The deposition shield 11 and exhaust plate 83 are preferably made of an aluminum body covered with a ceramic, such as $Y_2O_3$.

A conductive member (GND block) 91 is disposed on a portion of the deposition shield 11 that constitutes the chamber inner wall, at a height essentially the same as the wafer W, and is connected to ground in the sense of DC. This arrangement provides the effect of preventing abnormal electric discharge, as described later. The position of the conductive member 91 is not limited to that shown in FIG. 1, as long as it is inside the plasma generation area. For example, the conductive member 91 may be disposed on the susceptor 16 side, such as the periphery of the susceptor 16, or it may be disposed near the upper electrode, such as a position around the upper electrode 34, in the form of a ring.

Respective components of the plasma processing apparatus, such as the power supply system, gas supply system, drive system, and RF controller 95, are connected to and controlled by a control section (overall control unit) 100. The control section 100 is connected to a user interface 101 including, e.g., key board and a display, wherein the key board is used for a process operator to input commands for operating the plasma processing apparatus, and the display is used for showing visualized images of the operational status of the plasma processing apparatus.

Further, the control section 100 is connected to a storage section 102 that stores control programs for the control section 100 to control the plasma processing apparatus so as to perform various processes, and programs or recipes for respective components of the plasma processing apparatus to perform processes in accordance with process conditions. Recipes are stored in a storage medium of the storage section 102. The storage medium may be a hard disk or semiconductor memory, or it may be a portable storage medium, such as a CDROM, DVD, or flash memory. Further, recipes may be utilized on-line, while it is transmitted from another apparatus through, e.g., a dedicated line, as needed.

A required recipe is retrieved from the storage section 102 and executed by the control section 100 in accordance with an instruction or the like input through the user interface 101. Consequently, the plasma processing apparatus can perform a predetermined process under the control of the control section 100. It should be noted that each of the plasma processing apparatuses (plasma etching apparatuses) according to embodiments of the present invention includes such a control section 100.

When an etching process is performed in the plasma processing apparatus described above, the gate valve 86 is first opened, and a semiconductor wafer W to be etched is transferred through the transfer port 85 into the chamber 10 and placed on the susceptor 16. Then, a process gas for etching is supplied from the process gas supply source 66 into the gas diffusion cell 40 at a predetermined flow rate, and then supplied into the chamber 10 through the gas flow channels 41 and gas delivery holes 37. At the same time, the interior of the chamber 10 is exhausted by the exhaust unit 84 to set the pressure inside the chamber 10 at a predetermined value within a range of, e.g., 0.1 to 150 Pa. The process gas may be selected from various gases conventionally employed, and preferably is a gas containing a halogen element, a representative of which is a fluorocarbon gas ($C_xF_y$), such as $C_4F_8$ gas. Further, the process gas may contain another gas, such as Ar gas or $O_2$ gas.

While the etching gas is supplied into the chamber 10, an RF power for plasma generation is applied from the first RF power supply 48 to the upper electrode 34. At the same time, an RF power for ion attraction is applied from the second RF power supply 90 to the lower electrode or susceptor 16. Also, a predetermined DC voltage is applied from the variable DC power supply 50 to upper electrode 34. Further, a DC voltage is applied from the DC power supply 22 for the electrostatic chuck 18 to the electrode 20 of the electrostatic chuck 18 to fix the semiconductor wafer W by the electrostatic chuck 18.

The process gas delivered from the gas delivery holes 37 formed in the electrode plate 36 of the upper electrode 34 is turned into plasma by glow discharge caused by the RF power applied across the upper electrode 34 and the lower electrode or susceptor 16. Radicals and ions generated in this plasma are used to etch the target surface of the semiconductor wafer W. As described above, a first RF power for plasma generation is applied to the upper electrode 34, and a second RF power for ion attraction is applied to the lower electrode or susceptor 16. Consequently, the plasma control margin can be set broader.

In this embodiment, when plasma is generated, the upper electrode 34 is supplied with an RF power within a range covering high frequencies of 27 MHz or more. Consequently, the plasma density is increased with a preferable state, so that high density plasma is generated even under a low pressure condition.

When the plasma is thus generated, the controller 51 controls the polarity and value of the DC voltage applied from the variable DC power supply 50 to the upper electrode 34. In this case, the application electrode or upper electrode 34 is set to have a self bias voltage $V_{dc}$ on the surface, at a deep level for obtaining a predetermined (moderate) sputtering effect onto the surface, i.e., the surface of the electrode plate 36. In other words, control is performed to increase the absolute value of $V_{dc}$ on the surface of the upper electrode 34. Where the RF power applied from the first RF power supply 48 is low, polymers are deposited on the upper electrode 34. However, since a suitable DC voltage is applied from the variable DC power supply 50, polymers deposited on the upper electrode 34 are sputtered, thereby cleaning up the surface of the upper electrode 34. Further, an optimum quantity of polymers can be supplied onto the semiconductor wafer W, thereby canceling the surface roughness of the photo-resist film, and increasing the etching selectivity of an etching target layer relative to the underlying film.

Where a DC voltage is applied to the upper electrode 34, the body of the upper electrode 34 is sputtered, so that the photo-resist film is provided with carbide on the surface, and is thereby reinforced. Further, since the self bias voltage $V_{dc}$ is deeper, the thickness of a plasma sheath formed on the upper electrode 34 is increased, and the plasma is shrunk by that much. In this case, the effective residence time above the semiconductor wafer W is decreased, and the plasma concentrates above the wafer W, thereby decreasing the dissociation space. Consequently, dissociation of a fluorocarbon family process gas is suppressed for the photo-resist film to be less etched. Further, where a DC voltage is applied to the upper electrode 34, electrons generated near the upper electrode 34 are accelerated in the vertical direction within the process space, whereby the shading effect is suppressed to obtain a good processed shape without bowing. It should be noted that, in this case, the application current or application power may be controlled in place of the application voltage from the variable DC power supply 50.

As described above, where a DC voltage is applied to the upper electrode 34, various effects are provided. Particularly, the effect of suitably supplying polymers onto the target substrate or semiconductor wafer W can increase the selectivity between the etching target film and underlying etching-stopper film. However, etching may be performed on an etching target film formed of an SiOC family Low-k film with an underlying etching-stopper film formed of an SiC film that is a low dielectric constant barrier film. In this case, their compositions are very similar, and thus the conditional margin for ensuring a sufficient etching selectivity between them is very narrow even where a DC voltage is applied.

Next, an explanation will be given of a specific example of this issue.

Figure 6:
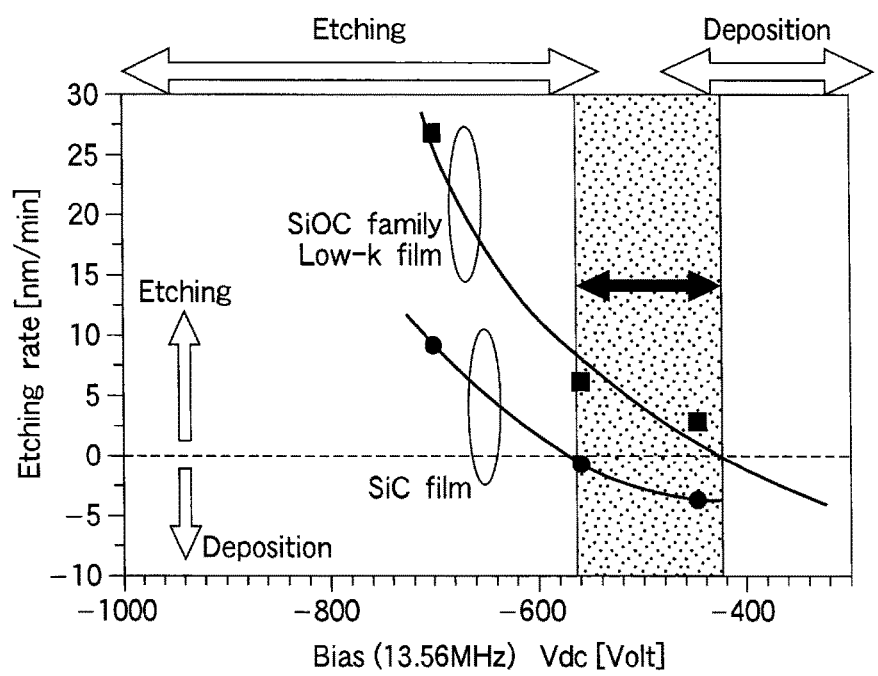
FIG. 6 is a graph showing etching characteristics of an etching target film formed of an SiOC family Low-k film and an etching-stopper film formed of an SiC film, obtained by a bias applied in a normal mode.

FIG. 6 is a graph showing etching characteristics of an SiOC family Low-k film and an SiC film, wherein the horizontal axis denotes the self bias voltage $V_{dc}$ of a bias RF power (13.56 MHz) applied from the second RF power supply 90, and the vertical axis denotes the etching rate. In obtaining this data, the process gas was $C_4F_8/Ar/N_2$ set at flow rates of 10 mL/min (sccm), 500 mL/min (sccm), and 100 mL/min (sccm), respectively, and at a pressure of 6 Pa. Further, the first RF power supply 48 was set to apply an RF power with a frequency of 60 MHz at 1,000 W, and the second RF power supply 90 was set to apply an RF power with a frequency of 13.56 MHz at 2,000 W. When plasma is generated within the chamber, polymers are supplied from the upper electrode to the semiconductor wafer, and deposition is generated if no bias is applied. However, with an increase in the absolute value of the self bias voltage $V_{dc}$, etching starts making progress. At this time, in order to etch the SiOC family Low-k film with high accuracy, $V_{dc}$ is preferably set such that the SiOC family Low-k film is etched while the underlying SiC film is not etched. However, the compositions of the SiOC family Low-k film and SiC film are close to each other, and thus their etching behaviors are similar, as shown in FIG. 6. In this case, ordinary etching can provide only a very narrow margin for performing etching with a high selectivity, and thus can hardly allow the etching rate to be increased.

Ions are attracted by a bias applied to the etching target film and promote etching, but polymers are supplied and deposited on the etching target film, as described above. Accordingly, in order for the etching to make progress, $V_{dc}$ (ion energy incident on the wafer) needs to be selected such that the ion penetration depth is larger than the polymer thickness. On the other hand, after the etching target film is etched, if the polymer thickness deposited on the underlying film is larger than the ion penetration depth, etching of the underlying film is stopped, thereby realizing high selectivity etching. However, where the etching behaviors of the etching target film and underlying film are similar as shown in FIG. 6, if over etching is continuously performed after the etching target film is etched at a high etching rate, the polymer thickness on the underlying film is smaller than the ion penetration depth when the etching target film is penetrated, and thus the underlying film is eroded.

In light of this phenomenon, this embodiment adopts control to set the polymer thickness to be larger than the ion penetration depth when the etching target film is penetrated, i.e., at the timing of transition from etching of the etching target film to over etching. This control is made by power modulation performed in predetermined cycles between a first power set to deposit polymers on the etching target film and a second power set to etch the etching target film on the target substrate. At this time, in accordance with an instruction from the control section 100, the RF controller 95 switches the second RF power supply 90 from a normal mode to a power modulation mode. In this way, the first power is used to deposit polymers and the second power is used to promote etching, so that the polymer layer is formed to have a lager thickness than the ion penetration depth when over etching starts, thereby stopping etching without substantially eroding the etching-stopper film.

The issue described above will be explained in more detail, with reference to drawings.

The following explanation is exemplified by a structure including a Cu interconnection line layer 201, on which an etching-stopper film formed of an SiC film 202 and an etching target film formed of an SiOC family Low-k film 203 are laminated in this order. Etching of the SiOC family Low-k film 203 is performed while a photo-resist film 204 is used as a mask.

Figure 7:
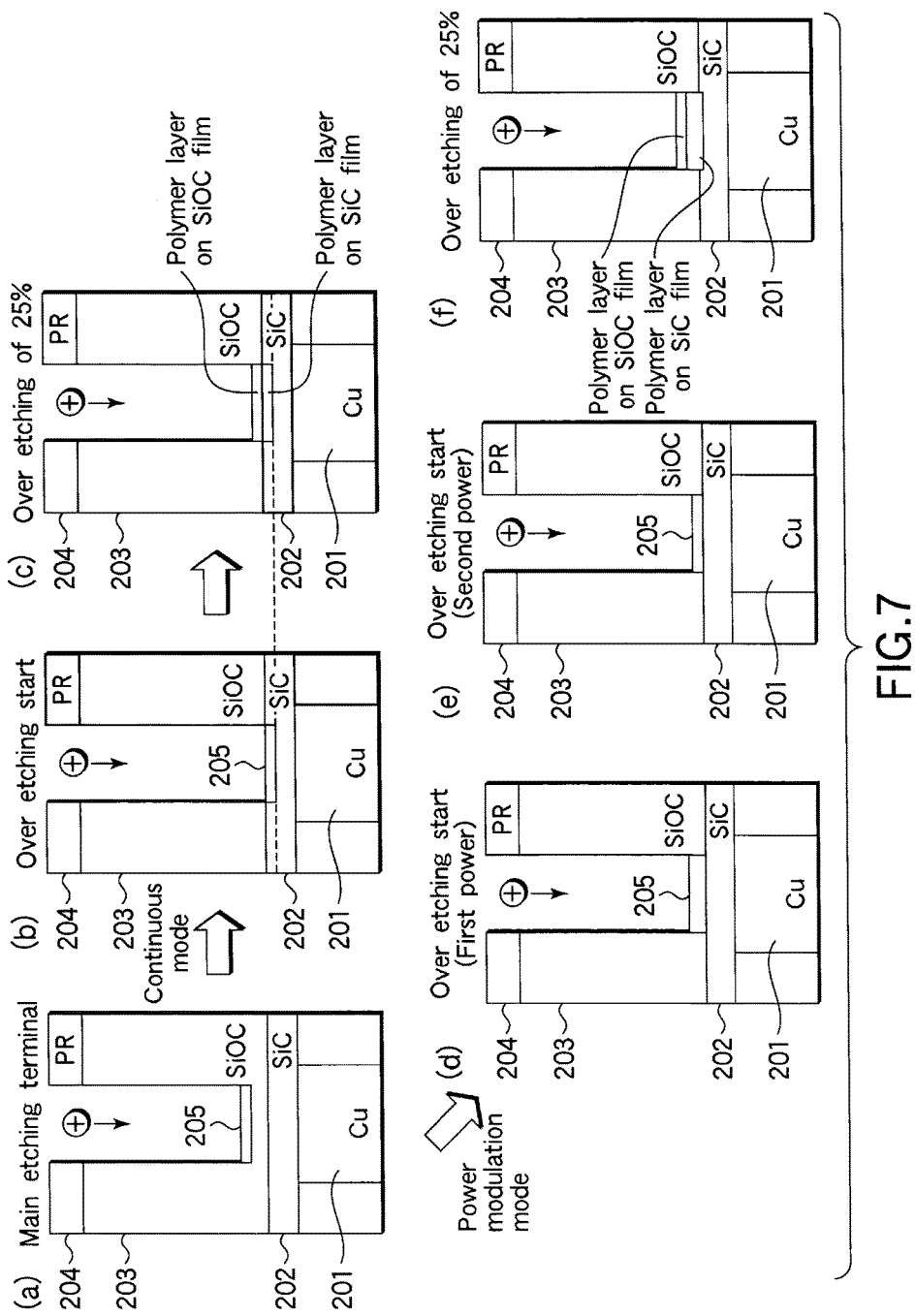
FIG. 7 is a view showing a change in a structure including an etching-stopper film formed of an SiC film and an etching target film formed of an SiOC family Low-k film laminated in this order from below, where etching and over etching are sequentially performed on the SiOC family Low-k film, for comparing an etching state using a bias applied in a continuous mode with an etching state using a bias applied in a power modulation mode.

As regards a conventional continuous mode, the main etching terminal state is shown in FIG. 7, (a), and the instant when the SiOC family Low-k film 203 is penetrated (at the instant when over etching starts) is shown in FIG. 7, (b). In the state shown in FIG. 7, (b), the thickness of a polymer layer 205 on the underlying SiC film 202 at the hole bottom is small, so the SiC film 202 is eroded by etching. Then, as shown in FIG. 7, (c), when the SiC film 202 is eroded to a certain extent, the over etching is saturated (over etching of 25%).

On the other hand, according to this embodiment, the mode is switched to the power modulation mode in the main etching terminal state shown in FIG. 7, (a). In this case, as shown in FIG. 7, (d), at the instant when over etching starts, the first power is applied so that the thickness of the polymer layer 205 on the SiC film 202 at the hole bottom is increased. Then, as shown in FIG. 7, (e), although the second power etching mode is used thereafter, the ion penetration depth is smaller than the thickness of the polymer layer 205. Consequently, as shown in FIG. 7, (f), the etching-stopper film formed of the SiC film 202 is hardly eroded.

Figure 8:
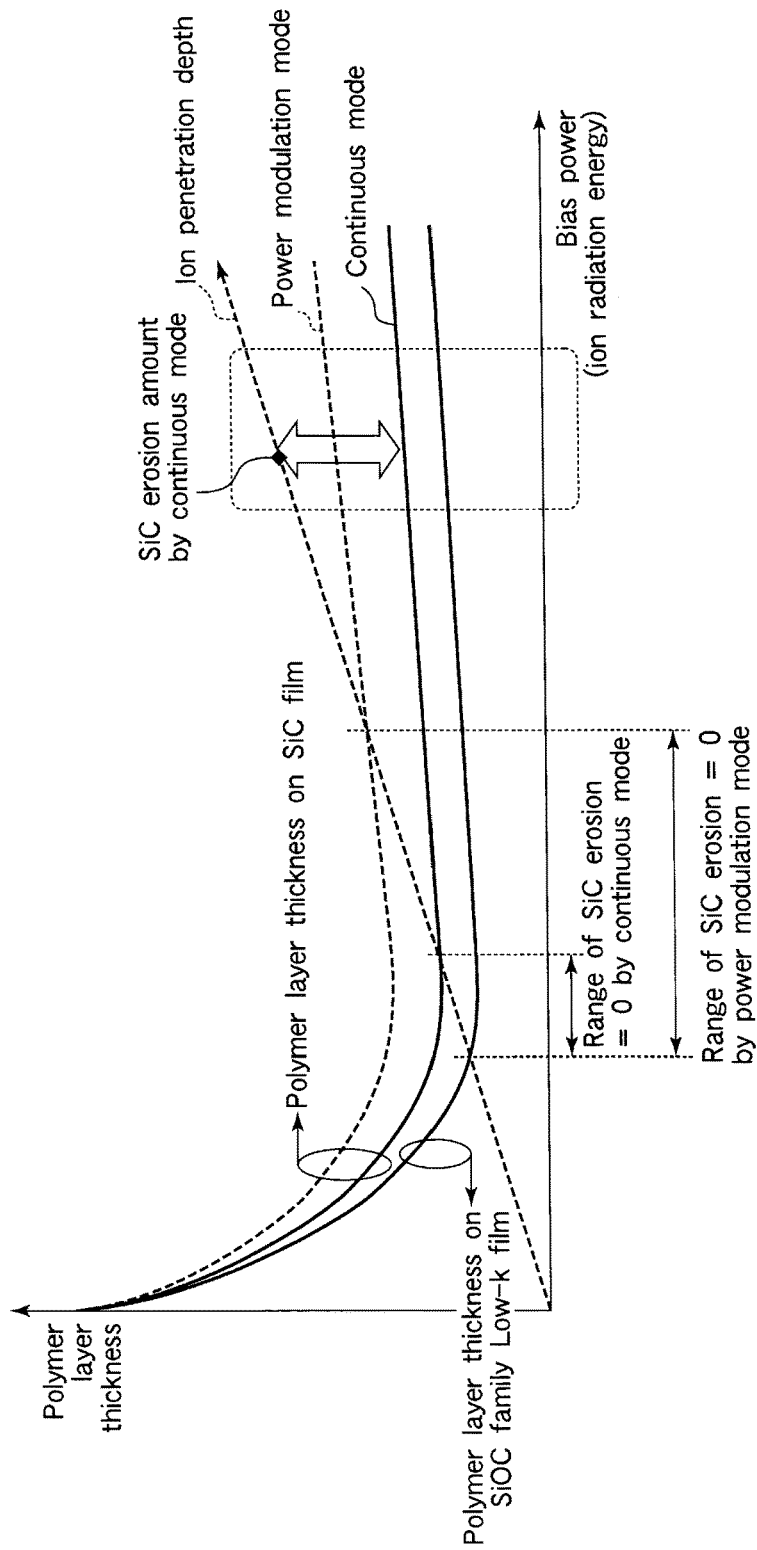
FIG. 8 is a graph showing the relationship between the polymer layer thickness and ion penetration depth, wherein the horizontal axis denotes a bias power and the vertical axis denotes the polymer layer thickness, for comparing a case using a bias applied in a continuous mode with a case using a bias applied in a power modulation mode.

FIG. 8 is a graph schematically showing the phenomenon described above, wherein the horizontal axis denotes the bias power and the vertical axis denotes the polymer layer thickness. FIG. 8 also shows the ion penetration depth into the polymer layer 205 or SiC film 202 (the scale is the same as that of the polymer depth). As shown in FIG. 8, in the case using the continuous mode, since the etching characteristics of the SiOC family Low-k film 203 and SiC film 202 are similar, such a range is very narrow where the ion penetration depth is smaller than the thickness of the polymer layer 205 on the SiC film 202 and thus the SiC film 202 is not eroded, as described above. In this case, the bias power needs to be smaller to decrease the etching rate of the SiOC family Low-k film 203. On the other hand, in the case using the bias power modulation immediately before the over etching, such a range is expanded where the SiC film 202 is not eroded. In this case, the bias power can be larger to increase the etching rate of the SiOC family Low-k film 203.

Figure 9:
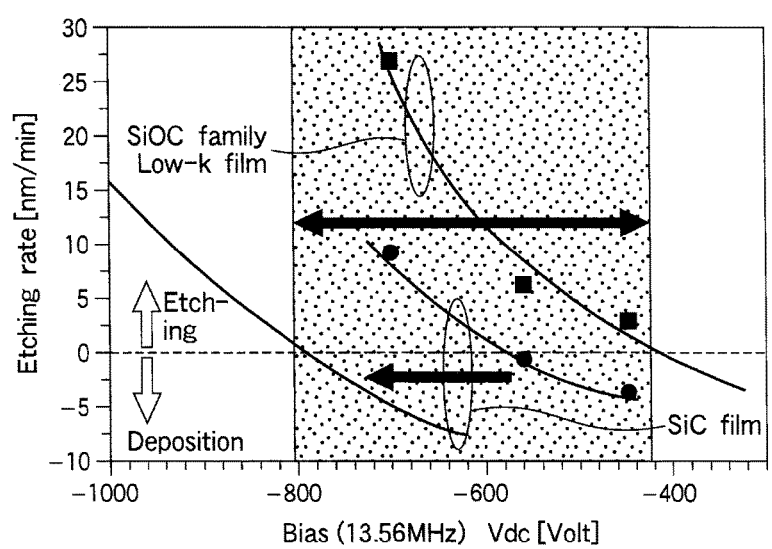
FIG. 9 is a graph showing etching characteristics of an etching target film formed of an SiOC family Low-k film and an etching-stopper film formed of an SiC film, obtained by a bias applied in a power modulation mode.

FIG. 9 shows a process margin obtained by the case using the bias power modulation, for comparison with the case using the continuous mode shown in FIG. 6. As shown in FIG. 9, where the power modulation is used immediately before the over etching, the process margin becomes broader. For example, even where $V_{dc}$ is set at about −800V to perform etching at a high etching rate, it is possible to hardly etch the underlying SiC film, while etching the etching target film formed of the SiOC family Low-k film. In other words, the etching target film formed of the SiOC family Low-k film can be etched with a high etching rate and high selectivity relative to the underlying film.

Figure 10:
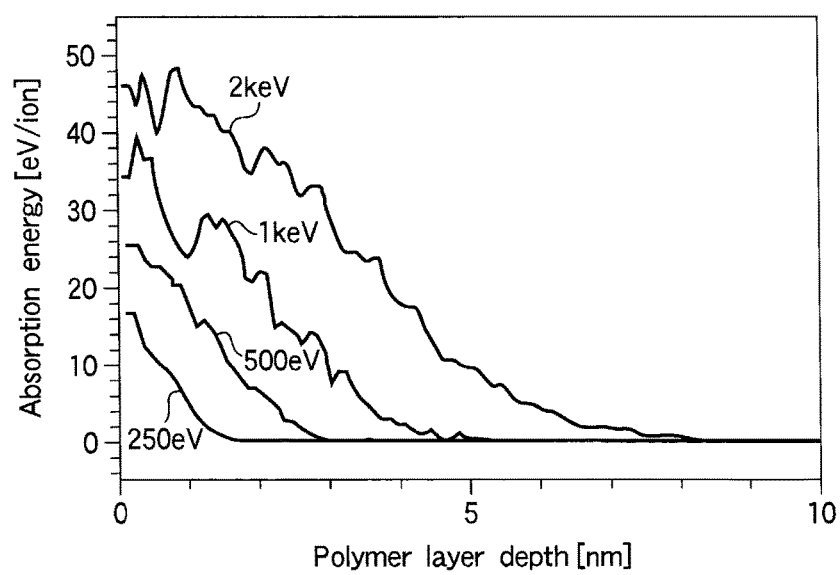
FIG. 10 is a graph showing the relationship between the polymer layer depth and the absorption energy of ions (Ar ions), obtained by a simulation with different values of ion radiation energy.

FIG. 10 is a graph showing the relationship between the polymer layer depth and the absorption energy of ions (Ar ions), obtained by a simulation with different values of ion radiation energy. The ordinary etching is known such that the distribution of ion radiation energy is mainly formed of a range of 500 eV to 1 keV. As shown in FIG. 10, an ion energy absorption range of up to 1 keV corresponds to a polymer thickness of less than about 5 nm. Accordingly, where the polymer thickness is several nm or more, and preferable 5 nm or more, the ion penetration depth becomes smaller than the polymer layer thickness.

In this embodiment, as described above, a pulse-wise waveform is a typical example used for power modulation performed on the RF power of the second RF power supply 90, but this is not limiting. For example, where the first power and second power are modulated, another waveform, such as a sine curve, may be used.

In the power modulation, the low-power-level first power is preferably set to be larger than 0. Where this power is set at a certain lever larger than 0, polymer deposition is effectively supplied. Although the first power and second power are suitably set in accordance with other etching conditions and/or film conditions, but the first power is preferably set to be within a range of 10 to 500 W, and the second power is preferably set to be within a range of 100 to 5,000 W, and more preferably of 100 to 1,000 W.

The frequency of power modulation is preferably set to be 0.25 to 100 Hz. With this range, the polymer layer is moderately generated. Specifically, it is assumed that the power modulation (pulse) has a duty ratio of 50%. In this case, if the frequency is larger than 100 Hz, the time of the first power for generating polymer deposition is less than 10 mS in one cycle, so it may be difficult to generate sufficient deposition. If the frequency is less than 0.25 Hz, the time of the first power is larger than 2S in one cycle, so the thickness of the polymer layer may be too large.

The duty ratio (second power time/one cycle total time) of the power modulation (pulse) is typically exemplified by 50%. However, the duty ratio may be suitably adjusted within a range of 1 to 99%, in accordance with etching conditions and/or conditions of the etching target film and underlying film.

When etching is performed, the etching target film is first etched at a high etching rate in a normal mode using no bias power modulation. Before etching of the etching target film is finished, the bias power is switched into the power modulation mode described above. This switching needs to be made at a timing such that a suitable amount of polymer layer is formed on the underlying film when the underlying film is making an appearance due to etching of the etching target film. If the switching into the power modulation mode is made immediately before over etching, the polymer layer thickness is insufficient for the over etching. On the other hand, this switching is made too early, the etching rate is decreased. Accordingly, in order to ensure a time period for forming a suitable amount of polymer layer on the underlying film that is making an appearance, the switching is preferably made at a timing very close to the instant when the over etching starts. Although it depends on etching conditions, the switching is preferably made at a timing when the remaining of the etching target film has a thickness of 20 to 30 nm.

When etching is performed in this power modulation mode, a DC voltage is applied from the variable DC power supply 50 to the upper electrode 34. This is advantageous to ensure the presence of a polymer layer, because the polymer supply effect can be obtained, as described above. When no DC voltage is applied, reflected waves are increased due to the bias power modulation, in the RF power for plasma generation applied from the first RF power supply to the upper electrode 34, thereby making plasma unstable. Accordingly, a DC voltage is applied from the variable DC power supply 50 to the upper electrode 34, so that the thickness of a plasma sheath formed on the upper electrode 34 side is fixed. In this case, reflected waves are decreased in the RF power for plasma generation applied to the upper electrode 34, thereby making plasma stable. Consequently, the process stability and the service life of the first RF power supply 48 are improved. This is another reason as to why the DC voltage application is advantageous.

Although the DC voltage applied to the upper electrode 34 is suitably set in accordance with etching conditions, the DC voltage is preferably set to be within a range of −300 to −2 kV in both of the ordinary continuous mode and power modulation mode.

The frequency of the RF power applied from the first RF power supply 48 to the upper electrode 34 is preferably set to be within a range of 27 to 100 MHz in both of the ordinary continuous mode and power modulation mode. The frequency of the RF power applied from the second RF power supply 90 to the susceptor 16 is preferably set to be within a range of 400 kHz to 13.56 MHz in both of the ordinary continuous mode and power modulation mode. The power of the RF power applied from the first RF power supply 48 is preferably set to be within a range of 500 to 5,000 W in both of the ordinary continuous mode and power modulation mode. The power of the RF power for bias applied from the second RF power supply 90 is preferably set to be within a range of 500 to 5,000 W in the ordinary continuous mode.

Next, an explanation will be given of experiments performed to confirm effects of this embodiment.

Samples were first prepared to each have a structure such that a 30-nm SiC film was formed as an underlying film, a 300-nm SiOC family Low-k film was formed thereon as an etching target film, and a BARC (anti-reflection coating) and a patterned ArF resist film were then formed thereon. Then, the BARC was etched by use of the ArF resist film as a mask, and the SiOC family Low-k film is etched to form a via-hole. Etching conditions used at this time were set as follows. In one example (present example), over etching was performed by use of a bias applied in a power modulation mode according to this embodiment. In another example (comparative example), over etching was performed by use of a bias applied in a conventional continuous mode.

(1) Main Etching (Continuous Mode)
Pressure inside chamber=6.65 Pa (50 mT);
Upper side application RF power (60 MHz)=400 W;
Lower side application RF power (400 kHz)=500 W;
Process gas and flow rate=$C_4F_8$/Ar/$N_2$ of 4/1,000/500 mL/min (sccm);
Upper side DC voltage=−900V; and
Time=60 sec.
(2) Over Etching
(a) Present Example
Pressure inside chamber=6.65 Pa (50 mT);
Upper side application RF power (60 MHz)=400 W;
Lower side application RF power (400 kHz)=modulation between 100 W/800 W;
Power modulation pulse parameter,
Frequency=15.0 Hz,
Duty ratio=50%, and
Vpp=1.4V;
Process gas and flow rate=$C_4F_8$/Ar/$N_2$ of 8/1,000/80 mL/min (sccm); and
Upper side DC voltage=−900V.
(b) Comparative Example
Pressure inside chamber=6.65 Pa (50 mT);
Upper side application RF power (60 MHz)=400 W;
Lower side application RF power (400 kHz)=800 W;
Process gas and flow rate=$C_4F_8$/Ar/$N_2$ of 4/1,000/500 mL/min (sccm); and
Upper side DC voltage=−900V.
(3) Common Condition
Temperature=upper electrode/wafer/lower electrode of 60/60/0° C.

After etching was performed under the conditions described above, each sample was immersed in 1%-HF solution for 30 sec to examine the SiC erosion amount. In the present example, the bias power application was switched from the normal mode to the power modulation mode 30 sec before the over etching started.

Figure 11:
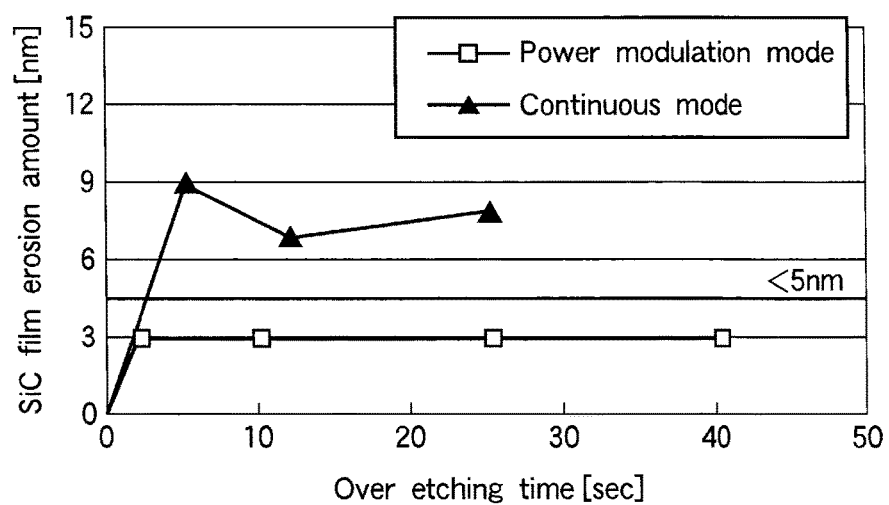
FIG. 11 is a graph showing a result of an experiment performed for confirming effects of this embodiment.

FIG. 11 shows this result. FIG. 11 is a graph that compares the present example and comparative example, wherein the horizontal axis denotes the over etching time and the vertical axis denotes the erosion amount (nm) of the SiC film. As shown in FIG. 11, in the comparative example, the SiC film was largely eroded by about 9 nm immediately after the over etching started. In the present example, the SiC film was eroded by about 3 nm at the beginning, and then this erosion was essentially constant or kept saturated until over etching of 40%. Accordingly, it has been confirmed that the bias power modulation mode according to this embodiment is effective.

In this embodiment, the etching target film is formed of an SiOC family (organic) Low-k film, but it may be formed of an inorganic Low-k film. The underlying film is formed of an SiC film, but it may be formed of, e.g., a silicon nitride film (SiN). Further, in this embodiment, the etching target film formed of an SiOC family Low-k film is combined with the underlying film formed of an SiC film, but the disclosed technique may be applied to any structure that has a difficulty in ensuring the selectivity of an etching target film relative to an underlying film. Furthermore, in this embodiment, the bias is switched from the continuous mode to power modulation mode, but the power modulation mode may be solely used as long as a sufficient etching rate is obtained.

Next, an alternative application according to this embodiment will be explained.

The following application is a case where the power modulation mode described above is utilized to increase the selectivity of an etching target film relative to a mask.

Figure 12:
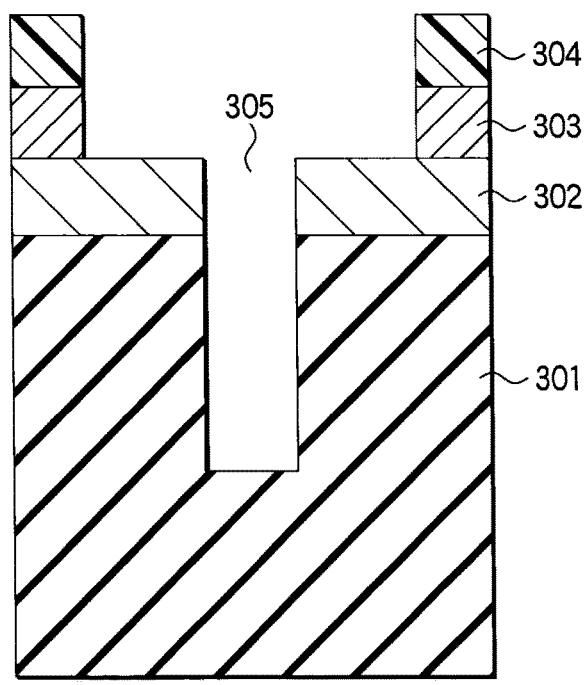
FIG. 12 is a sectional view showing a semiconductor wafer used in a case where an RF bias is applied to the lower electrode in a power modulation mode, in order to improve the selectivity of an etching target film relative to a mask.

FIG. 12 is a sectional view showing the structure of a semiconductor wafer used in this case. This structure includes a Low-k film 301, on which a hard mask layer formed of a TiN film 302, an inorganic sacrificial film 303, and a photo-resist film 304 are laminated in this order. The hard mask layer may be formed of a Ti film in place of the TiN film. In this structure, where the Low-k film 301 is etched by use of the TiN film 302 as a mask to form a hole 305, the selectivity of the Low-k film 301 relative to the TiN film 302 is preferably larger. For this purpose, it is effective to perform etching while controlling the second RF power supply 90 to set a power modulation mode such that etching can make progress on the Low-k film 301, but it can hardly make progress on the TiN film 302 because of a large polymer deposition thereon.

Next, another alternative application according to this embodiment will be explained.

The following application is a case where the power modulation mode described above is utilized to alleviate the micro-loading effect.

Figure 13:
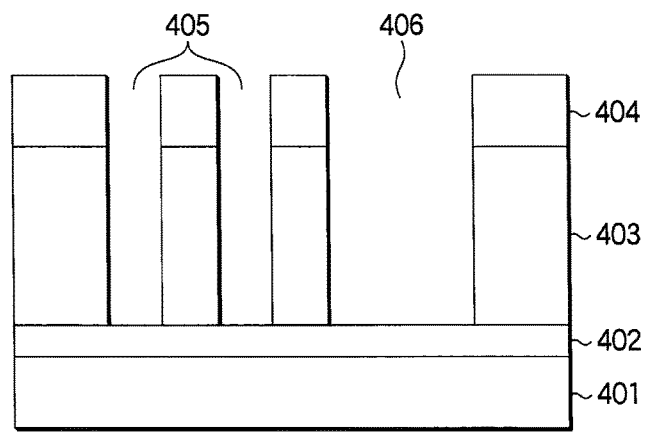
FIG. 13 is a sectional view showing a semiconductor wafer used in a case where an RF bias is applied to the lower electrode in a power modulation mode, in order to alleviate the micro-loading effect.

FIG. 13 shows a structure including an underlying film 401, on which an etching-stopper film formed of an SiC film 402, and an etching target film formed of an SiOC family Low-k film 403 are laminated in this order. The SiOC family Low-k film 403 is etched by use of a photo-resist film 404 as a mask to form a smaller size via-hole 405 and a larger area trench 406, such as a guard ring (GR). In this case, due to the micro-loading effect, the etching rate of the smaller size via-hole 405 tends to be lower because CF family radicals cannot easily get in, while the etching rate of the larger size trench 406 tends to be higher.

In order to suppress this micro-loading effect, it is effective to perform etching while applying a bias in the power modulation mode described above. Where the bias is applied in the power modulation mode, only the etching rate of the larger area trench 406 is suppressed to alleviate the micro-loading effect. Specifically, as described above, in the power modulation mode, the etching makes progress when the high-power-level second power is applied, and the etching is suppressed due to CF family precursor deposition when the low-power-level first power is applied. The effect of suppressing the etching is exerted more on the larger area trench 406, so the difference in etching rate between the via-hole 405 and trench 406 is decreased, thereby alleviating the micro-loading effect.

Next, an explanation will be given of experiments performed in a practical manner of this application.

Figure 14A:
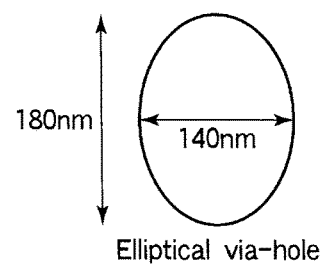
FIGS. 14A, 14B, and 14C are views showing the shapes and sizes of holes used in etching for confirming the effect of alleviating the micro-loading effect.
Figure 14B:
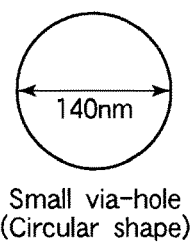
Figure 14C:
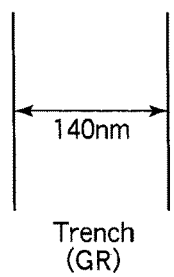

An etching target film formed of an SiOC family Low-k film was etched to form an elliptical via-hole, a circular small via-hole, and a trench (GR) having sizes, as shown in FIGS. 14A, 14B, and 14C, respectively. An example using a power modulation mode was compared with an example using a continuous mode, both modes being applied on the lower side application RF power.

Conditions used at this time were set as follows.

(1) Common Condition:
Pressure inside chamber=6.65 Pa (50 mT);
Upper side application RF power (60 MHz)=400 W;
Upper side DC voltage=−900V;
Temperature=upper electrode/wafer/lower electrode of 60/60/0° C.;
Process gas and flow rate=$C_4F_8$/Ar/$N_2$ of 10/1,000/100 mL/min (sccm); and
Time=30 sec.

(2) Power Modulation Mode:
Lower side application RF power (13.56 MHz)=modulation between 100 W/700 W; and
Power modulation pulse parameter,
Frequency=15.0 Hz, and
Duty ratio=50%.

(3) Continuous Mode:
Lower side application RF power (13.56 MHz)=continuous application of 700 W.

Figure 15:
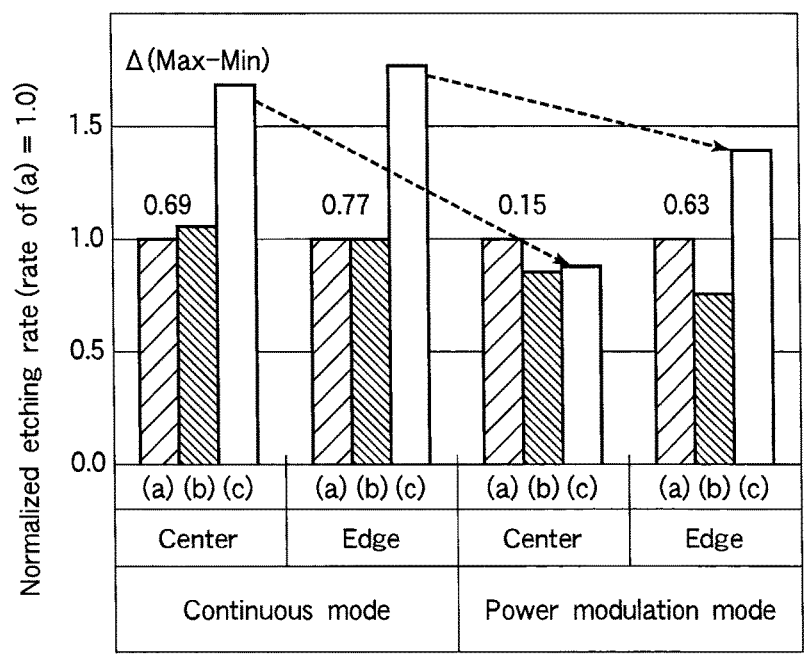
FIG. 15 is a graph showing normalized etching rates obtained by use of the hole shapes shown in FIGS. 14A, 14B, and 14C, where an RF bias was applied to the lower electrode in a power modulation mode and in a continuous mode, in order to alleviate the micro-loading effect.

Table 1 shows values of the etching rate at the center and edge obtained by the etching using these modes. Table 2 shows values normalized by use of values of the etching rate of the elliptical via-hole shown in FIG. 14A, set as a reference value of 1.0. FIG. 15 shows a graph of Table 2.

TABLE 1

|  |  | Hole shape | | Unit: nm/min |
| --- | --- | --- | --- | --- |
|  |  | (a) | (b) | (C) |
| Continuous mode | Center | 143 | 152 | 241 |
| (700 W) | Edge | 117 | 117 | 207 |
| Power modulation | Center | 94 | 80 | 81 |
| mode (100/700 W) | Edge | 84 | 64 | 117 |

TABLE 2

|  |  | Hole shape | | | |
| --- | --- | --- | --- | --- | --- |
|  |  | (a) | (b) | (C) | Max − Min |
| Continuous mode | Center | 1.0 | 1.1 | 1.7 | 0.69 |
| (700 W) | Edge | 1.0 | 1.0 | 1.8 | 0.77 |
| Power modulation | Center | 1.0 | 0.9 | 0.9 | 0.15 |
| mode (100/700 W) | Edge | 1.0 | 0.8 | 1.4 | 0.63 |

As shown in Tables 1 and 2 and FIG. 15, where the RF bias was applied to the lower electrode in the continuous mode, a micro-loading effect was observed such that the etching rate of the larger area trench (GR) was larger than those of the elliptical via-hole and small via-hole. Where the RF bias was applied in the power modulation mode, the etching rate of the trench (GR) was decreased more than the other portions, so the micro-loading effect was alleviated.

In this embodiment, plasma is generated by use of the power modulation mode on the second RF power supply 90. In this case, the second RF power supply 90 is preferably operated in the continuous mode using a constant power level for plasma ignition, and then operated in the power modulation mode, to reliably maintain the plasma. In this case, the application timing and application manner of the RF power and DC voltage are important issues. Accordingly, preferable application timing and application manner of the RF power and DC voltage will be explained with reference to FIGS. 16 to 18.

Figure 16:
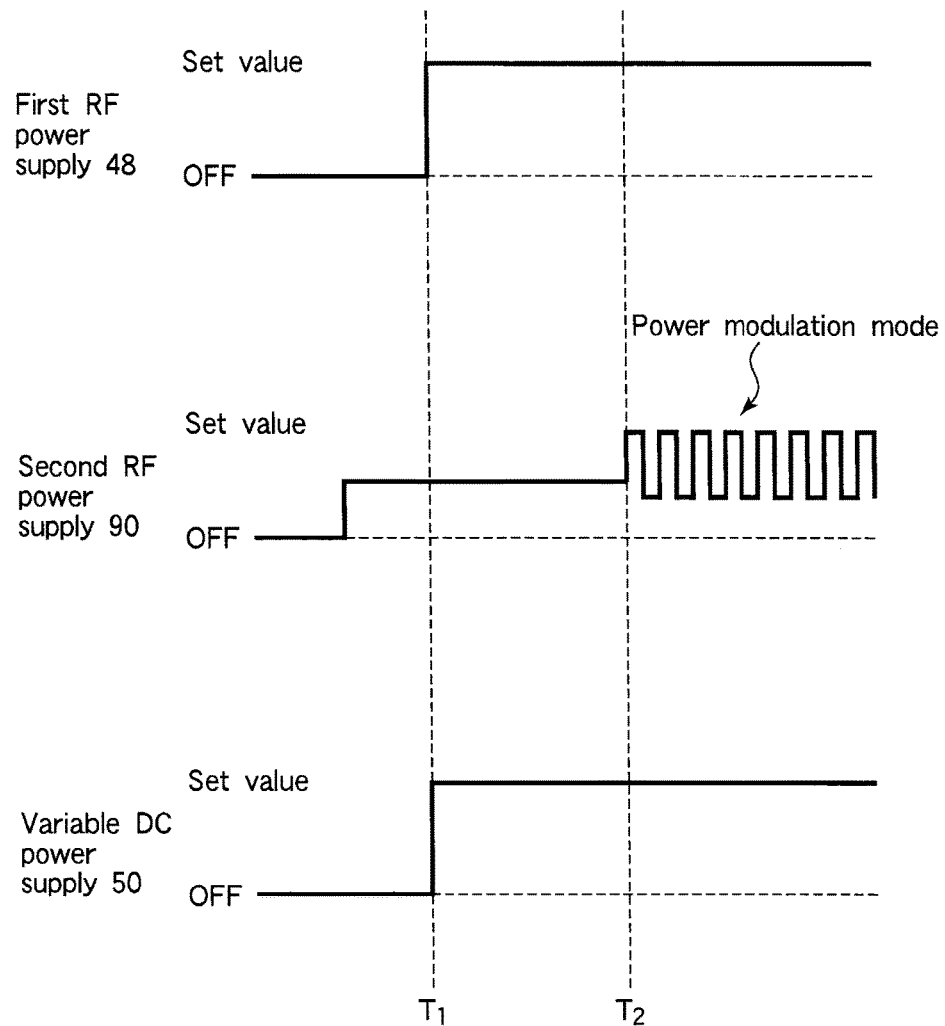
FIG. 16 is a view showing a preferable example of application timing and application manner of RF powers and a DC voltage.

In the case shown in FIG. 16, the RF power applied from the second RF power supply 90 to the lower electrode or susceptor 16 is first set in a continuous mode at a power level lower than the high-power-level second power. Then, at a time point T1 when a predetermined time has elapsed, the RF power applied from the first RF power supply 48 to the upper electrode 34 is started. At the same time, the DC voltage applied from the variable DC power supply 50 to the upper electrode 34 is started. In this state, plasma is ignited, and then, at a time point T2 when the plasma becomes stable, the second RF power supply 90 is switched to the power modulation mode. In this case, since the power modulation mode is used after the plasma becomes stable, the plasma can be reliably maintained even when the low-power-level first power is supplied in the power modulation mode. It should be noted that this control is executed by the RF controller 95. This matter is common to the cases shown in FIGS. 17 and 18.

Figure 17:
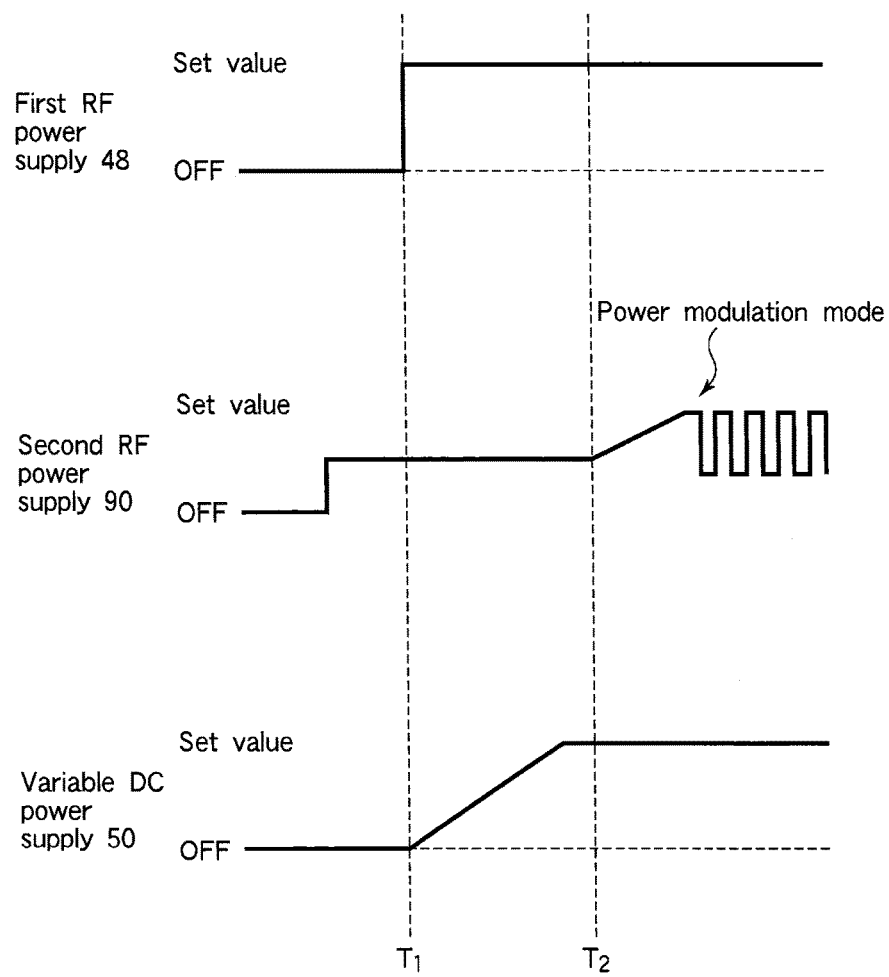
FIG. 17 is a view showing an alternative preferable example of application timing and application manner of RF powers and a DC voltage.

In the case shown in FIG. 17, the power applied from the second RF power supply 90 is slowly increased to the value of the high-power-level second power, and is then switched to the power modulation mode. Further, the DC voltage applied from the variable DC power supply 50 is slowly increased. Where the power and voltage are slowly increased, the wafer and/or power supplies are less damaged. Only one of the power and voltage may be slowly increased.

Figure 18:
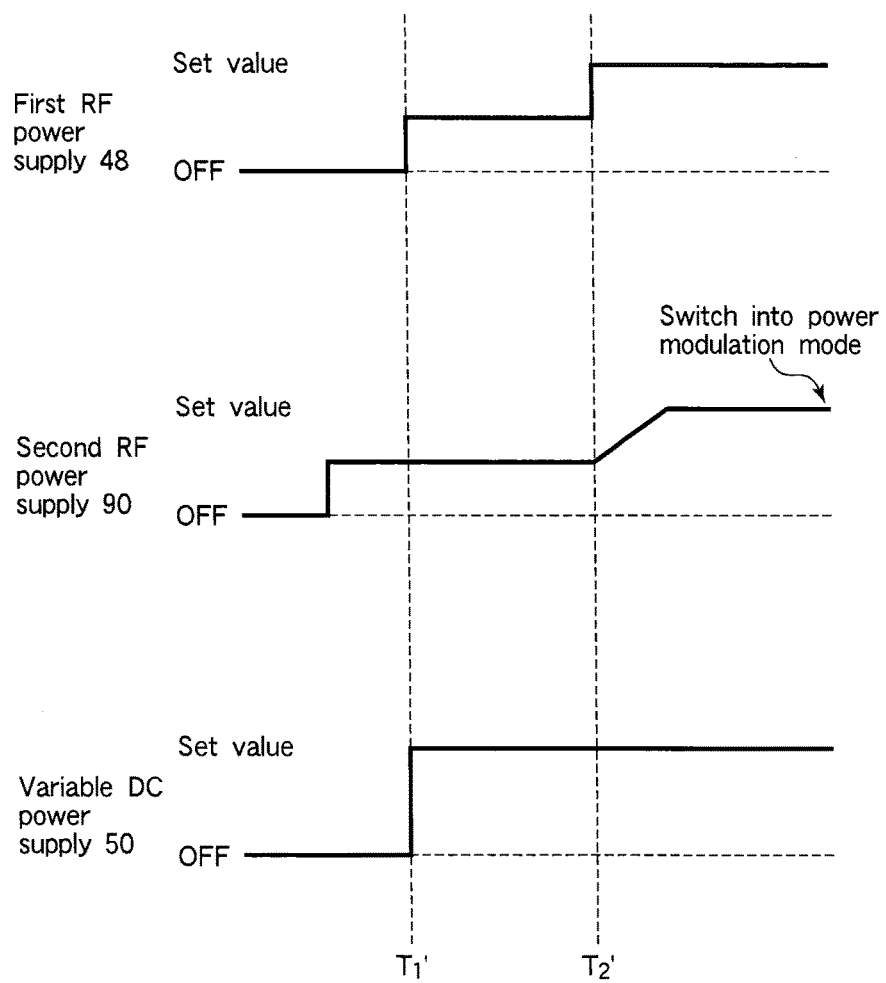
FIG. 18 is a view showing another alternative preferable example of application timing and application manner of RF powers and a DC voltage.

In the case shown in FIG. 18, the RF power applied from the second RF power supply 90 to the lower electrode or susceptor 16 is first set in a continuous mode at a power level lower than the high-power-level second power. Then, at a time point T1' when a predetermined time has elapsed, the RF power applied from the first RF power supply 48 to the upper electrode 34 is started at a power level lower than the set value. At the same time, the DC voltage applied from the variable DC power supply 50 to the upper electrode 34 is started. In this state, plasma is ignited, and then, at a time point T2' when the plasma becomes stable, the RF power applied from the first RF power supply 48 is increased to the set value, and the RF power applied from the second RF power supply 90 is increased to a predetermined value (for example, to the value of the second power). In this case, the power from the second RF power supply 90 is preferably slowly increased, as shown in FIG. 18. Then, at a predetermined timing after the time point T2', the second RF power supply 90 is switched to the power modulation mode. In this case, since the power modulation mode is used after the plasma becomes stable, the plasma can be reliably maintained even when the low-power-level first power is supplied in the power modulation mode. Also in this case, the DC voltage applied from the variable DC power supply 50 may be slowly increased.

The power modulation mode may be applied not only to the second RF power supply 90 but also to the first RF power supply 48. Such an example will be described below.

Figure 19A:
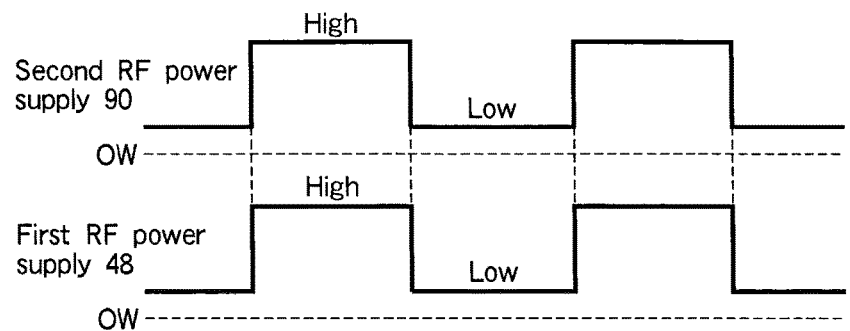
FIGS. 19A and 19B are views showing examples in which, not only the second RF power supply, but also the first RF power supply is set in a power modulation mode.
Figure 19B:
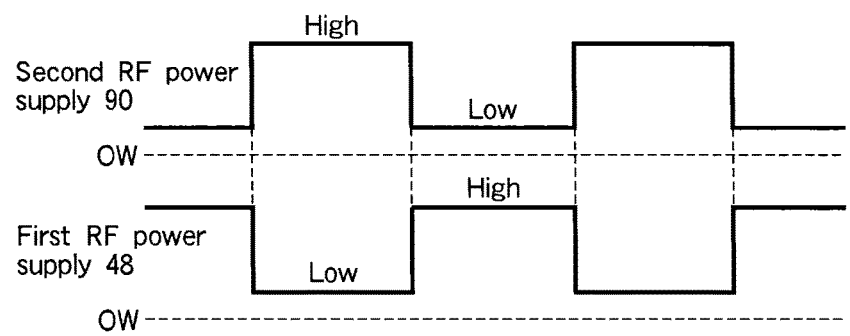

Specifically, in order to stabilize plasma, it may be preferable to set the first RF power supply 48 in the power modulation mode, when setting the second RF power supply 90 in the power modulation mode. In this case, the RF controller 95 is arranged to control both of the second RF power supply 90 and first RF power supply 48 to perform power modulation. Specifically, the first RF power supply 48 is controlled to perform power modulation between a third power and a fourth power in synchronism with the power modulation mode of the second RF power supply 90. In this case, for example, as shown in FIG. 19A, the first RF power supply 48 and second RF power supply 90 may be controlled to have high powers and low powers at the same timing. Alternatively, as shown in FIG. 19B, the first RF power supply 48 and second RF power supply 90 may be controlled to have high powers and low powers at opposite timing.

Next, an explanation will be given of a second embodiment of the present invention.

Figure 20:
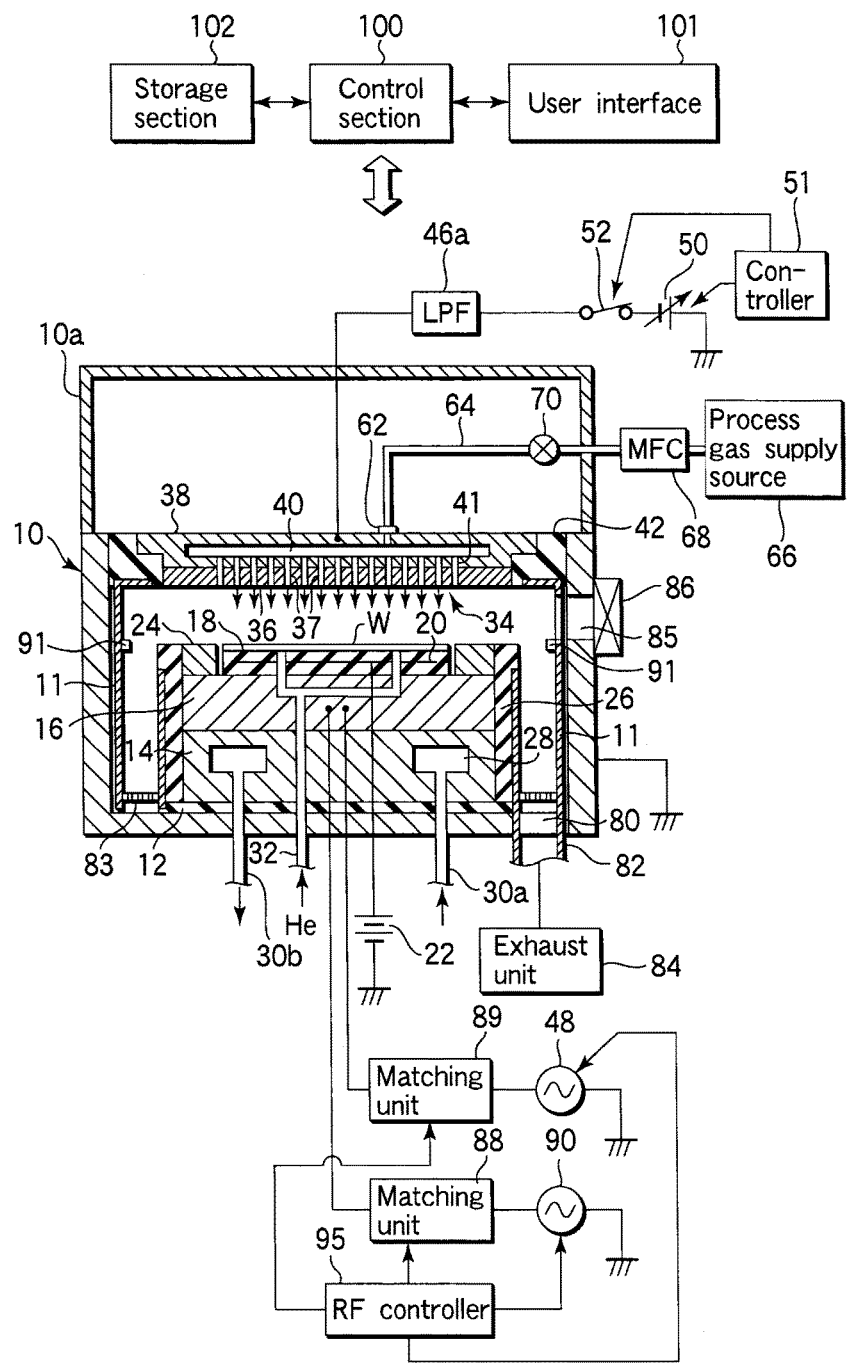
FIG. 20 is a sectional view schematically showing a plasma etching apparatus according to a second embodiment of the present invention.

FIG. 20 is a sectional view schematically showing a plasma etching apparatus according to a second embodiment of the present invention.

This plasma etching apparatus has a structure essentially the same as that of the plasma etching apparatus according to the first embodiment except that an RF power for plasma generation is applied to the lower electrode or susceptor. Accordingly, the same constituent elements as those in FIG. 1 are denoted by the same reference numerals in FIG. 20, and their description will be omitted.

In this embodiment, a lower electrode or susceptor 16 is connected to both of a first RF power supply 48' for plasma generation and a second RF power supply 90 for applying a bias for ion attraction. The first RF power supply 48' is connected to the susceptor 16 through a first matching unit 89. The first matching unit 89 has the same structure as the second matching unit 88, and, when plasma is generated within a chamber 10, it performs control for the load impedance and the output impedance of the first RF power supply 48' to apparently agree with each other. The first RF power supply 48' has the same function as the first RF power supply 48 of the first embodiment, and preferably has a frequency within a range of 27 to 100 MHz.

On the other hand, the upper electrode 34 is not connected to any RF power supply, but is connected to a variable DC power supply 50 through a low-pass filter (LPF) 46*a*. The low-pass filter (LPF) 46*a* is arranged to trap the RF powers from the first and second RF power supplies, and is preferably formed of an LR filter or LC filter In this embodiment, the plasma etching apparatus is of the type that applies two RF powers with different frequencies to the lower side, i.e., a first radio frequency (RF) power for plasma generation and a second radio frequency (RF) power for ion attraction are applied to the lower electrode. This type has the following advantages, as compared to the other plasma etching apparatus of the capacitive coupling type.

First, as in this embodiment, where an RF power for plasma generation is applied to the lower electrode, plasma is generated near the wafer, and dissociation of the process gas is suppressed because plasma is prevented from widely diffusing. Consequently, even where the pressure inside the process container is high and the plasma density is low, the etching rate on the wafer can be increased. Further, even where the RF power for plasma generation has a high frequency, it is possible to ensure relatively large ion energy and thus attain a high efficiency. By contrast, where an RF power for plasma generation is applied to the upper electrode as in the first embodiment, plasma is generated near the upper electrode. In this case, it is relatively difficult to increase the etching rate on the wafer, if the pressure inside the process container is high and the plasma density is low.

In addition, unlike apparatuses of the type that applies an RF power with one frequency to the lower electrode, where an RF power for plasma generation and an RF power for ion attraction are independently applied to the lower electrode as in this embodiment, the function of generating plasma and the function of attracting ions, both necessary for plasma etching, can be independently controlled. In this case, it is possible to satisfy the etching conditions required in high micro-fabrication.

According to this embodiment, in a plasma etching apparatus of the type that applies two RF powers with different frequencies to the lower side, which has the functions described above, a DC voltage is applied to the upper electrode, so that additional functions are obtained, as described above. Consequently, it is possible to provide high performance etching, which is more suitable for recent etching micro-fabrication. Further, the bias RF power modulation is used in the same way as the first embodiment, so that the etching target film can be etched with a high selectivity and a high etching rate, even where the compositions of the etching target film and underlying film are similar, as in a combination of an SiOC family Low-k film and an SiC film.

This embodiment may be utilized to increase the selectivity of an etching target film relative to an underlying film, as in a case where an SiOC film is etched on an underlying SiC film; to increase the selectivity of an etching target film relative to a mask, as in a case where a Low-k film is etched by use of a TiN film as a mask; or to alleviate the micro-loading effect, as in the first embodiment. Further, in this embodiment, the plasma ignition sequence shown in FIG. 16 may be used, and/or the first RF power supply 48' may be operated in the power modulation mode. In this embodiment, the etching target film is an SiOC family (organic) Low-k film, but it may be formed of an inorganic Low-k film. The underlying film is formed of an SiC film, but it may be formed of, e.g., a silicon nitride film (SiN). Further, in this embodiment, the etching target film formed of an SiOC family Low-k film is combined with the underlying film formed of an SiC film, but the disclosed technique may be applied to any structure that has a difficulty in ensuring the selectivity of an etching target film relative to an underlying film.

In each of the embodiment described above, the first RF power and second RF power may have frequencies, as follows. Specifically, the frequency of the first RF power may be one of 27 MHz, 40 MHz, 60 MHz, 80 MHz, and 100 MHz, while the frequency of the second RF power may be one of 400 kHz, 800 kHz, 1 MHz, 2 MHz, 3.2 MHz, 12.88 MHz, and 13.56 MHz. They are suitably combined in accordance with a process to be performed.

According to the embodiments described above, a second RF power supply unit for ion attraction is operated in a power modulation mode that executes power modulation in predetermined cycles between a first power set to deposit polymers on a predetermined film on a target substrate and a second power set to promote etching of the predetermined film on the target substrate. The predetermined film can be provided with a moderate polymer layer deposited thereon to suppress etching progress, so that the etching can be performed with a high selectivity and a high etching rate. For example, it is assumed that a target substrate has a structure including an etching target film formed on an underlying film, and the etching target film is first etched and over etching is then performed. Alternatively, it is assumed that a target substrate has a structure including a mask layer formed on an etching target film, and the etching target film is etching by use of the mask layer as a mask. In either case, this power modulation mode is adopted, so that the etching target film is etched with a high selectivity and a high etching rate.

Further, where the power modulation mode is used, the etching rate of a large area, such as a large guard ring (GR), is suppressed, so the micro-loading effect is suppressed without changing process conditions.

The present invention has been described with reference to embodiments, but the present invention is not limited to the embodiments described above, and it may be modified in various manners. For example, in the embodiments described above, a DC voltage is applied to the upper electrode, but the DC voltage application is not essential.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma etching apparatus comprising:
a process container configured to be vacuum-exhausted;
a first electrode disposed inside the process container;
a second electrode disposed opposite to the first electrode and configured to support a target substrate thereon;
a first RF power supply unit connected to the first electrode or the second electrode and configured to apply a first RF power for plasma generation to the first electrode or the second electrode;
a second RF power supply unit connected to the second electrode and configured to apply a second RF power for providing a bias for ion attraction to the second electrode;
a process gas supply unit configured to supply a process gas into the process container; and
an RF controller configured to control the second RF power supply unit,
wherein the second RF power supply unit includes a second RF power supply connected to the second electrode, and a second matching unit interposed between the second electrode and the second RF power supply,
wherein the second matching unit includes components for performing a matching operation for an internal impedance of the second RF power supply and a load impedance including plasma within the process container to agree with each other,
wherein the RF controller is arranged to directly control the second RF power supply and the second matching unit individually,
wherein the RF the controller is configured to switch the second RF power supply unit between a continuous mode that executes continuous supply of the second RF power at a constant power level and a power modulation mode that executes modulation of the second RF power between different power levels,
wherein during the power modulation mode, the RF controller directly controls the second RF power supply to operate with power modulation in predetermined cycles which repeat over a duration of the second RF power supply being switched to the power modulation mode, wherein within each predetermined cycle, the power supplied by the second RF power supply switches between a first power larger than zero and a second power larger than the first power, and
wherein, during the power modulation mode, the RF controller directly controls the second matching unit to switch setting of the components in synchronism with the power modulation, such that the second matching unit does not perform the matching operation over each duration of the first power being applied, and the second matching unit performs the matching operation over each duration of the second power being applied.

2. The plasma etching apparatus according to claim 1, wherein, in the power modulation mode, the RF controller directly controls the second RF power supply such that, when the first power is applied, the second RF power supply keeps constant a power value supplied to the second electrode, which is defined by a difference between a power value output from the second RF power supply and a power value reflected by the load impedance including plasma within the process container.

3. The plasma etching apparatus according to claim 1, wherein the apparatus further comprises a variable DC power supply configured to apply a DC voltage to the first electrode.

4. The plasma etching apparatus according to claim 1, wherein the first RF power has a frequency of 27 to 100 MHz.

5. The plasma etching apparatus according to claim 1, wherein the second RF power has a frequency of 400 kHz to 13.56 MHz.

6. The plasma etching apparatus according to claim 1, wherein the first power is set to be within a range of 10 to 500W and the second power is set to be within a range of 100 to 5,000 W and larger than the first power, in the power modulation mode of the second RF power supply unit.

7. The plasma etching apparatus according to claim 1, wherein the power modulation has a frequency within a range of 0.25 to 100 Hz in the power modulation mode of the second RF power supply unit.

8. The plasma etching apparatus according to claim 1, wherein the power modulation has a duty ratio (second power time/one cycle total time) of 1 to 99% in the power modulation mode of the second RF power supply unit.

9. The plasma etching apparatus according to claim 1, wherein the RF controller directly controls the first RF power supply unit to operate with power modulation in predetermined cycles between a third power and a fourth power in synchronism with the power modulation mode of the second RF power supply unit.

10. The plasma etching apparatus according to claim 1, wherein the first and second powers of the power modulation mode respectively have DC components equal to each other in set voltage.

11. The plasma etching apparatus according to claim 1, wherein the first RF power supply unit is connected to the first electrode.

12. The plasma etching apparatus according to claim 1, wherein the second matching unit includes first and second variable capacitors, as some of the components, such that the second variable capacitor is disposed on an electric feeding line connecting the second electrode and the second RF power supply, and the first variable capacitor is disposed on a line branched from the electric feeding line, and wherein, in the power modulation mode, the RF controller switches setting of the first and second variable capacitors to switch the second matching unit as to whether to perform the matching operation.

13. The plasma etching apparatus according to claim 12, wherein the second matching unit includes, as some of the components, a coil disposed on the electric feeding line at a position between the second electrode and the second variable capacitor.

14. The plasma etching apparatus according to claim 1, further comprising a main control section configured to control an operation of the plasma etching apparatus and including a non-transitory storage medium storing a control program, wherein the control program is programmed to control the plasma etching apparatus by the main control section to conduct a plasma etching sequence for processing a target substrate while switching the second RF power supply unit by the RF controller between the continuous mode and the power modulation mode.

* * * * *